US008987156B2

(12) United States Patent
D'Evelyn et al.

(10) Patent No.: US 8,987,156 B2
(45) Date of Patent: Mar. 24, 2015

(54) POLYCRYSTALLINE GROUP III METAL NITRIDE WITH GETTER AND METHOD OF MAKING

(71) Applicant: Soraa, Inc., Fremont, CA (US)

(72) Inventors: Mark P. D'Evelyn, Santa Barbara, CA (US); Derrick S. Kamber, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 17 days.

(21) Appl. No.: 13/894,220

(22) Filed: May 14, 2013

(65) Prior Publication Data

US 2013/0251615 A1  Sep. 26, 2013

Related U.S. Application Data

(63) Continuation-in-part of application No. 12/634,665, filed on Dec. 9, 2009, now Pat. No. 8,461,071.

(60) Provisional application No. 61/122,332, filed on Dec. 12, 2008.

(51) Int. Cl.
*C04B 35/00* (2006.01)
*C01B 21/06* (2006.01)
*C30B 9/00* (2006.01)
*C30B 28/06* (2006.01)
*C30B 29/40* (2006.01)
*C30B 7/10* (2006.01)

(52) U.S. Cl.
CPC .............. *C01B 21/0632* (2013.01); *C30B 9/00* (2013.01); *C30B 28/06* (2013.01); *C30B 29/403* (2013.01); *C30B 7/10* (2013.01)

USPC .................. 501/96.1; 501/96.4; 501/97.1

(58) Field of Classification Search
CPC .. C04B 35/581; C04B 35/645; C04B 35/583; C04B 35/584; C04B 35/593
USPC ........... 501/96.1, 96.4, 97.1, 97.2, 97.3, 98.4, 501/98.5
See application file for complete search history.

(56) References Cited

U.S. PATENT DOCUMENTS 3,245,760 A   4/1966   Sawyer
3,303,053 A   2/1967   Strong et al.
(Continued)

FOREIGN PATENT DOCUMENTS

CN   101061570   10/2007
JP   2005-289797  10/2005
(Continued)

OTHER PUBLICATIONS

USPTO Office Action for U.S. Appl. No. 13/472,356 dated Dec. 9, 2013 (11 pages).
(Continued)

*Primary Examiner* — Noah Wiese
(74) *Attorney, Agent, or Firm* — Kilpatrick Townsend & Stockton LLP

(57) ABSTRACT

A gettered polycrystalline group III metal nitride is formed by heating a group III metal with an added getter in a nitrogen-containing gas. Most of the residual oxygen in the gettered polycrystalline nitride is chemically bound by the getter. The gettered polycrystalline group III metal nitride is useful as a raw material for ammonothermal growth of bulk group III nitride crystals.

23 Claims, 6 Drawing Sheets

(56) References Cited

U.S. PATENT DOCUMENTS

| | | |
|---|---|---|
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | von Platen |
| 5,098,673 A | 3/1992 | Engel et al. |
| 5,169,486 A | 12/1992 | Young et al. |
| 5,474,021 A | 12/1995 | Tsuno et al. |
| 5,868,837 A | 2/1999 | DiSalvo et al. |
| 6,090,202 A | 7/2000 | Klipov |
| 6,129,900 A * | 10/2000 | Satoh et al. ............. 423/446 |
| 6,152,977 A | 11/2000 | D'Evelyn |
| 6,273,948 B1 | 8/2001 | Porowski et al. |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwili ski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 * | 2/2003 | Johnson et al. ............. 428/688 |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 | 12/2004 | D'Evelyn et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0021582 A1 | 2/2006 | Saito et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |

(56) References Cited

U.S. PATENT DOCUMENTS

| | | |
|---|---|---|
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255341 A1 | 11/2006 | Pinnington et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1* | 6/2007 | Park et al. ............. 438/584 |
| 2007/0142204 A1* | 6/2007 | Park et al. ............. 501/98.4 |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D' Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 2007-039321 | 2/2007 |
| WO | WO 2004/030061 | 4/2004 |
| WO | WO 2005/121415 | 12/2005 |
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2012/016033 | 2/2012 |

OTHER PUBLICATIONS

USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
Copel et al., 'Surfactants in Epitaxial Growth', Physical Review Letters, Aug. 7, 1989, vol. 63, No. 6, p. 632-635.
Lu et al., 'Structure of the CI-passivated GaAs(111) surface', Physical Review B, Nov. 15, 1998, vol. 58, No. 20, pp. 13820-13823.
Massies et al., 'Surfactant mediated epitaxial growth of InxGa1—xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.

(56) References Cited

OTHER PUBLICATIONS

USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/272,981 dated Aug. 15, 2013, 13 pages.
Altoukhov et al., 'High reflectivity airgap distributed Bragg reflectors realized by wet etching of AlInN sacrificial layers', Applied Physics Letters, vol. 95, 2009, pp. 191102-1-191102-3.
Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the uprise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and optical properties of bulk GaN crystals fabricated through hydride vapor phase epitaxy with void-assisted separation', Journal of Applied Physics, 98, 2005, pp. 103509-1-103509-4.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013, 2 pages.
Wang et al , 'Ammonothermal Growth of GaN Crystals in Alkaline Solutions', Journal of Crystal Growth, vol. 287, 2006, pp. 376-380.
USPTO Office Action for U.S. Appl. No. 12/133,365 dated May 13, 2013.
USPTO Office Action for U.S. Appl. No. 12/497,969 dated May 16, 2013.
USPTO Notice of Allowance for U.S. Appl. No. 12/534,843 dated Jan. 24, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Office Action for U.S. Appl. No. 13/041,199 dated Mar. 12, 2013.
USPTO Notice of Allowance for U.S. Appl. No. 13/175,739 dated Mar. 21, 2013.
USPTO Notice of Allowance for U.S. Appl. No. 13/226,249 dated Feb. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
Byrappa et al., 'Handbook of Hydrothermal Technology: A Technology for Crystal Growth and Materials Processing', Noyes Publications, Park Ridge, New Jersey, 2001, p. 94-96 and 152.
Chiang et al., 'Luminescent Properties of Cerium-Activated Garnet Series Phosphor: Structure and Temperature Effects', Journal of the Electrochemical Society, vol. 155, No. 6, 2008, p. B517-B520.
Chiu et al., 'Synthesis and Luminescence Properties of Intensely Red-Emitting $M5Eu(WO4)4-x(MoO4)x$ (M = Li, Na, K) Phosphors', Journal of the Electrochemical Society, vol. 155, No. 3, 2008, p. J71-J78.
Choi et al., '2.51 microcavity InGaN light-emitting diodes fabricated by a selective dry-etch thinning process', Applied Physics Letters, 2007, 91(6), p. 061120.
Ci et al., '$Ca1-xMo1-ySiyO4:Eux3+$: A Novel Red Phosphor for White Light Emitting Diodes', Physica B, vol. 403, 2008, p. 670-674.
D'Evelyn et al., 'Bulk GaN Crystal Growth by the High-Pressure Ammonothermal Method', Journal of Crystal Growth, vol. 300, 2007, p. 11-16.
Dwilinski et al., 'Ammono Method of BN, AlN and GaN Synthesis and Crystal Growth', MRS Internet Journal Nitride Semiconductor Research, vol. 3, No. 25, 1998, p. 1-5.
Dwilinski et al., 'Excellent Crystallinity of Truly Bulk Ammonothermal GaN', Journal of Crystal Growth, vol. 310, 2008, p. 3911-3916.
Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, p. L761-L763.
Feezell et al., 'AlGaN-Cladding-Free Nonpolar InGaN/GaN Laser Diodes', Japanese Journal of Applied Physics, vol. 46, No. 13, 2007, p. L284-L286.
Frayssinet et al., 'Evidence of Free Carrier Concentration Gradient Along the c-Axis for Undoped GaN Single Crystals', Journal of Crystal Growth, vol. 230, 2001, p. 442-447.
Fukuda et al., 'Prospects for the Ammonothermal Growth of Large GaN Crystal', Journal of Crystal Growth, vol. 305, 2007, p. 304-310.
Happek, 'Development of Efficient UV-LED Phosphor Coatings for Energy Saving Solid State Lighting', University of Georgia, 2007, 22 pages.
Hashimoto et al., 'A GaN bulk crystal with improved structural quality grown by the ammonothermal method', Nature Materials, vol. 6, 2007, p. 568-671.
Hashimoto et al., 'Ammonothermal Growth of Bulk GaN', Journal of Crystal Growth, vol. 310, 2008, p. 3907-3910.
Hoppe et al., 'Luminescence in $Eu2+$-Doped $Ba2Si5N8$: Fluorescence, Thermoliminescence, and Upconversion', Journal of Physics and Chemistry of Solids, vol. 61, 2000, p. 2001-2006.
Iso et al., 'High Brightness Blue InGaN/GaN Light Emitting Diode on Nonpolar m-Plane Bulk GaN Substrate', Japanese Journal of Applied Physics, vol. 46, No. 40, 2007, p. L960-L962.
Kim et al., 'Improved Electroluminescence on Nonpolar m-Plane InGaN/GaN Qantum Well LEDs', Rapid Research Letters, vol. 1, No. 3, 2007, p. 125-127.
Kojima et al., 'Stimulated Emission at 474 nm From an InGaN Laser Diode Structure Grown on a (1122) GaN Substrate', Applied Physics Letters, vol. 91, 2007, p. 251107-251107-3.
Kolis et al., 'Materials Chemistry and Bulk Crystal Growth of Group III Nitrides in Supercritical Ammonia', Material Resources Society Symposium Proceedings, vol. 495, 1998, p. 367-372.
Kolis et al., 'Crystal Growth of Gallium Nitride in Supercritical Ammonia', Journal of Crystal Growth, vol. 222, 2001, p. 431-434.

(56) References Cited

OTHER PUBLICATIONS

Kubota et al., 'Temperature Dependence of Polarized Photoluminescence From Nonpolar m-Plane InGaN Multiple Quantum Wells for Blue Laser Diodes', Applied Physics Letter, vol. 92, 2008, p. 011920-1-011920-3.

Li et al., 'The Effect of Replacement of Sr by Ca on the Structural and Luminescence Properties of the Red-Emitting Sr2Si5N8:Eu2+ LED Conversion Phosphor', Journal of Solid State Chemistry, vol. 181, 2007, p. 515-524.

Lide et al., 'Thermal Conductivity of Ceramics and Other Insulating Materials', CRC Handbook of Chemistry and Physics, 91st Edition, 2010-2011, p. 12-203 and 12-204.

http://www.matbase.com/material/non-ferrous-metals/other/molybdenum/properties, Data Table for: Non-Ferrous Metals: Other Metals: Molybdenum, Mar. 28, 2011, p. 1.

Mirwald et al., 'Low-Friction Cell for Piston-Cylinder High Pressure Apparatus', Journal of Geophysical Research, vol. 80, No. 11, 1975, p. 1519-1525.

Motoki et al., 'Growth and Characterization of Freestanding GaN Substrates', Journal of Crystal Growth, vol. 237-239, 2002, p. 912-921.

Mueller-Mach et al., 'Highly Efficient All-Nitride Phosphor-Converted White Light Emitting Diode', Physica Status Solidi (a), vol. 202, 2005, p. 1727-1732.

Murota et al., 'Solid State Light Source Fabricated With YAG:Ce Single Crystal', Japanese Journal of Applied Physics, vol. 41, Part 2, No. 8A, 2002, p. L887-L888.

Okamoto et al., 'Continuous-Wave Operation of m-Plane InGaN Multiple Quantum Well Laser Diodes', Japanese Journal of Applied Physics, vol. 46, No. 9, 2007, p. L187-L189.

Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, p. L820- L822.

Pattison et al., 'Gallium Nitride Based Microcavity Light Emitting Diodes With 2? Effective Cavity Thickness', Applied Physics Letters, vol. 90, Issue 3, 031111 (2007) 3pages.

International Search Report & Written Opinion of PCT Application No. PCT/US2009/067745, dated Feb. 5, 2010, 9 pages total.

Peters, 'Ammonothermal Synthesis of Aluminium Nitride', Journal of Crystal Growth, vol. 104, 1990, p. 411-418.

Roder et al., 'Temperature dependence of the thermal expansion of GaN', Physics Review B, vol. 72., No. 085218, Aug. 24, 2005, 6 pages.

Sarva et al., 'Dynamic Compressive Strength of Silicon Carbide Under Uniaxial Compression', Material Sciences and Engineering, vol. A317, 2001, p. 140-144.

Sato et al., 'High Power and High Efficiency Green Light Emitting Diode on Free-Standing Semipolar (1122) Bulk GaN Substrate', Physica Status Solidi (RRL), vol. 1, No. 4, 2007, p. 162-164.

Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.

Schmidt et al., 'Demonstration of Nonpolar m-Plane InGaN/GaN Laser Diodes', Japanese Journal of Applied Physics, vol. 46, No. 9, 2007, p. L190-L191.

Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, p. 3314-3322.

Sizov et al., '500-nm Optical Gain Anisotropy of Semipolar (1122) InGaN Quantum Wells', Applied Physics Express, vol. 2, 2009, p. 071001-1-071001-3.

Tsuda et al., 'Blue Laser Diodes Fabricated on m-Plane GaN Substrates', Applied Physics Express, vol. 1, 2008, p. 011104-1-011104-3.

Tyagi et al., 'Semipolar (1011) InGaN/GaN Laser Diodes on Bulk GaN Substrates', Japanese Journal of Applied Physics, vol. 46, No. 19, 2007, p. L444-L445.

Wang et al., 'Ammonothermal Synthesis of III-Nitride Crystals', Crystal Growth & Design, vol. 6, No. 6, 2006, p. 1227-1246.

Wang et al., 'Synthesis of Dense Polycrystaline GaN of High Purity by the Chemical Vapor Reaction Process', Journal of Crystal Growth, vol. 286, 2006, p. 50-54.

Wang et al., 'New Red Y0.85Bi0.1Eu0.05V1—yMyO4 (M = Nb, P) Phosphors for Light-Emitting Diodes', Physica B, vol. 403, 2008, p. 2071-2075.

Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).

Yamamoto, 'White LED Phosphors: The Next Step', Proceeding of SPIE, 2010, p. 1-10.

Yang et al., 'Preparation and luminescence properties of LED conversion novel phosphors SrZnO2:Sm', Materials Letters, vol. 62, 2008, p. 907-910.

Zhong et al., 'High Power and High Efficiency Blue Light Emitting Diode on Freestanding Semipolar (1011) Bulk GaN Substrate', Applied Physics Letter, vol. 90, No. 23, 2007, p. 233504-1-233504-3.

Zhong et al., 'Demonstration of High Power Blue-Green Light Emitting Diode on Semipolar (1122) Bulk GaN Substrate', Electronics Letters, vol. 43, No. 15, 2007, p. 825-826.

USPTO Office Action for U.S. Appl. No. 12/133,364 dated Nov. 26, 2010 (5 pages).

USPTO Office Action for U.S. Appl. No. 12/133,364 dated Jun. 1, 2011 (7 pages).

USPTO Notice of Allowance for U.S. Appl. No. 12/133,364 dated Oct. 11, 2011 (5 pages).

USPTO Office Action for U.S. Appl. No. 12/133,365 dated Jun. 9, 2011 (17 pages).

USPTO Office Action for U.S. Appl. No. 12/133,365 dated Oct. 18, 2011 (22 pages).

USPTO Office Action for U.S. Appl. No. 12/334,418 dated Apr. 5, 2011 (20 pages).

USPTO Office Action for U.S. Appl. No. 12/334,418 dated Oct. 19, 2011 (24 pages).

USPTO Office Action for U.S. Appl. No. 12/478,736 dated Sep. 27, 2011 (10 pages).

USPTO Office Action for U.S. Appl. No. 12/478,736 dated Feb. 7, 2012 (6 pages).

USPTO Notice of Allowance for U.S. Appl. No. 12/478,736 dated Apr. 23, 2012 (7 pages).

USPTO Notice of Allowance for U.S. Appl. No. 12/478,736 dated Oct. 9, 2012 (4 pages).

USPTO Office Action for U.S. Appl. No. 12/484,095 dated Nov. 10, 2010 (9 pages).

USPTO Office Action for U.S. Appl. No. 12/484,095 dated Jul. 8, 2011 (12 pages).

USPTO Office Action for U.S. Appl. No. 12/497,969 dated Feb. 2, 2012 (20 pages).

USPTO Office Action for U.S. Appl. No. 12/497,969 dated Jul. 5, 2012 (18 pages).

USPTO Office Action for U.S. Appl. No. 12/534,838 dated May 3, 2011 (12 pages).

USPTO Office Action for U.S. Appl. No. 12/534,838 dated Jan. 13, 2012 (14 pages).

USPTO Office Action for U.S. Appl. No. 12/534,838 dated Mar. 20, 2012 (13 pages).

USPTO Notice of Allowance for U.S. Appl. No. 12/534,838 dated Jun. 8, 2012 (8 pages).

USPTO Office Action for U.S. Appl. No. 12/534,843 dated Sep. 10, 2012 (9 pages).

USPTO Office Action for U.S. Appl. No. 12/534,844 dated Sep. 16, 2010 (8 pages).

USPTO Office Action for U.S. Appl. No. 12/534,844 dated Feb. 4, 2011 (9 pages).

USPTO Notice of Allowance for U.S. Appl. No. 12/534,849 dated Jul. 31, 2012 (12 pages).

USPTO Office Action for U.S. Appl. No. 12/534,857 dated Sep. 1, 2010 (13 pages).

USPTO Notice of Allowance for U.S. Appl. No. 12/534,857 dated May 27, 2011 (5 pages).

USPTO Office Action for U.S. Appl. No. 12/546,458 dated Jul. 20, 2011 (4 pages).

(56) References Cited

OTHER PUBLICATIONS

USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (7 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (19 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (13 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (11 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/724,983 dated Mar. 5, 2012 (21 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (10 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (21 pages).
USPTO Office Action for U.S. Appl. No. 13/013,697 dated Jun. 9, 2014 (5 pages).
USPTO Office Action for U.S. Appl. No. 13/025,833 dated Jul. 12, 2012 (16 pages).
USPTO Office Action for U.S. Appl. No. 13/041,199 dated Nov. 30, 2012 (14 pages).
USPTO Office Action for U.S. Appl. No. 13/041,199 dated Apr. 29, 2014 (12 pages).
USPTO Office Action for U.S. Appl. No. 13/175,739 dated Dec. 7, 2012 (6 pages).
USPTO Office Action for U.S. Appl. No. 13/179,346 dated Aug. 17, 2012 (21 pages).
USPTO Office Action for U.S. Appl. No. 13/179,346 dated Dec. 13, 2012 (24 pages).
USPTO Office Action for U.S. Appl. No. 13/226,249 dated Oct. 10, 2012 (7 pages).
USPTO Notice of Allowance for U.S. Appl. No. 13/425,304 dated Aug. 22, 2012 (9 pages).
Communication from the Chinese Patent Office re 200980154756.9 dated Jun. 17, 2014 (10 pages).
USPTO Office Action for U.S. Appl. No. 12/484,095 dated Aug. 29, 2014 (10 pages).
USPTO Notice of Allowance for U.S. Appl. No. 13/013,697 dated Aug. 27, 2014 (5 pages).
USPTO Notice of Allowance for U.S. Appl. No. 13/041,199 dated Sep. 9, 2014 (9 pages).
USPTO Office Action for U.S. Appl. No. 13/160,307 dated Jun. 26, 2014 (19 pages).

* cited by examiner

> US 8,987,156 B2

POLYCRYSTALLINE GROUP III METAL NITRIDE WITH GETTER AND METHOD OF MAKING

This application is a continuation-in-part of U.S. patent application Ser. No. 12/634,665, filed on Dec. 9, 2009, now allowed, which claims priority to U.S. Patent Application No. 61/122,332, filed on Dec. 12, 2008, each of which is incorporated by reference in its entirety.

BACKGROUND

The present disclosure generally relates to processing of materials for growth of crystals. More particularly, the present disclosure provides a crystalline nitride material suitable for use as a raw material for crystal growth of a gallium-containing nitride crystal by an ammonobasic or ammonoacidic technique, but there can be others. In other embodiments, the present disclosure provides methods suitable for synthesis of polycrystalline nitride materials, but it would be recognized that other crystals and materials can also be processed. Such crystals and materials include, but are not limited to, GaN, AN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride containing crystalline materials serve as substrates for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Growth of nitride crystals by ammonothermal synthesis has been proposed. Ammonothermal crystal growth methods are expected to be scalable, as described by Dwilinski, et al. (J. Crystal Growth 310, 3911 (2008)), by Ehrentraut, et al. (J. Crystal Growth 305, 204 (2007)), by D'Evelyn, et al. (J. Crystal Growth 300, 11 (2007)), and by Wang, et al. [Crystal Growth & Design 6, 1227 (2006)]. The ammonothermal method generally requires a polycrystalline nitride raw material, which is then recrystallized onto seed crystals. An ongoing challenge of ammonothermally-grown GaN crystals is a significant level of impurities, which cause the crystals to be colored, e.g., yellowish, greenish, grayish, or brownish. The residual impurities may cause optical absorption in light emitting diodes fabricated on such substrates, negatively impacting efficiency, and may also affect the electrical conductivity and/or generate stresses within the crystals. One source of the impurities is the polycrystalline nitride raw material.

For example, gallium nitride crystals grown by hydride vapor phase epitaxy, a relatively more expensive, vapor phase method, have demonstrated very good optical transparency, with an optical absorption coefficient below 2 $cm^{-1}$ at wavelengths between about 405 nanometers and about 620 nanometers (Oshima, et al., J. Appl. Phys. 98, 103509 (2005)). However, the most transparent ammonothermally-grown gallium nitride crystals of which we are aware were yellowish and had an optical absorption coefficient below 5 $cm^{-1}$ over the wavelength range between about 465 nanometers and about 700 nanometers (D'Evelyn, et al., J. Crystal Growth 300, 11 (2007) and U.S. Pat. No. 7,078,731).

Several methods for synthesis of polycrystalline nitride materials have been proposed. Callahan, et al. (MRS Internet J. Nitride Semicond. Res. 4, 10 (1999); U.S. Pat. No. 6,406, 540)proposed a chemical vapor reaction process involving heating gallium metal in a vapor formed by heating $NH_4Cl$. Related methods have been discussed by Wang, et al. [J. Crystal Growth 286, 50 (2006)) and by Park, et al. [U.S. Application Publication Nos. 2007/0142204, 2007/0151509, and 2007/0141819). The predominant impurity observed was oxygen, at levels varying from about 16 to about 160 parts per million (ppm). The chemical form of the oxygen was not specified. An alternative method, involving heating in ammonia only and producing GaN powder with an oxygen content below 0.07 wt %, was disclosed by Tsuji (U.S. Publication No. 2008/0193363). Yet another alternative method, involving contacting Ga metal with a wetting agent such as Bi and heating in ammonia only, producing GaN powder with an oxygen content below 650 ppm, has been disclosed by Spencer, et al. (U.S. Pat. No. 7,381,391).

What is needed is a method for low-cost manufacturing of polycrystalline nitride materials that are suitable for crystal growth of bulk gallium nitride crystals and do not contribute to impurities in the bulk crystals.

SUMMARY

Disclosed herein are techniques related to processing of materials for growth of crystals are provided. More particularly, the present disclosure provides a crystalline nitride material suitable for use as a raw material for crystal growth of a gallium-containing nitride crystal by an ammonothermal technique, including ammonobasic or ammonoacidic technique, but there can be others. In other embodiments, the present disclosure provides methods suitable for synthesis of polycrystalline nitride materials, but it would be recognized that other crystals and materials can also be processed, including single crystal materials. Such crystals and materials include, but are not limited to, GaN, AN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present disclosure provides a composition for a material. The composition includes a polycrystalline group III metal nitride material having a plurality of grains. Preferably, the plurality of grains are characterized by a columnar structure. In a specific embodiment, one or more of the grains have an average grain size in a range of from about 10 nanometers to about 10 millimeters. The composition has an atomic fraction of a group III metal in the group III metal nitride in a range of from about 0.49 to about 0.55. In one or more embodiments, the metal in the group III metal nitride is selected from at least aluminum, indium, or gallium. The composition also has an oxygen content in the group III metal nitride material provided as a group III metal oxide or as a substitutional impurity within a group III metal nitride less than about 10 parts per million (ppm).

In an alternative specific embodiment, the present disclosure provides a method for forming a crystalline material. The method includes providing a group III metal in at least one crucible. Preferably, the group III metal comprises at least one metal selected from at least aluminum, gallium, and indium. The method includes providing a getter at a level of at least 100 ppm with respect to the group III metal. In a specific embodiment, the getter comprises at least one of alkaline earth metals, boron, carbon, scandium, titanium, vanadium, chromium, yttrium, zirconium, niobium, rare earth metals, hafnium, tantalum, and tungsten. The method also includes providing the group III metal in a crucible and providing the getter into a chamber. This chamber and associated components may also be referred to more generally as a reactor or an apparatus. The method transfers a nitrogen-containing material into the chamber and heats the chamber to a determined temperature. The method includes pressurizing the chamber to a determined pressure and processing the nitrogen-containing material with the group III metal in the chamber. In one or more embodiments, the method forms a polycrystalline group III metal nitride in at least the crucible that contained the group III metal. In one or more embodiments, the method forms a polycrystalline group III metal nitride within the chamber, which may substantially occur within the chamber in one or more regions that do not include the group III metal crucible.

In yet an alternative specific embodiment, the present disclosure provides an alternative method of forming a group III metal nitride containing substrate. The method includes providing a group III metal as a source material, which comprises at least one metal selected from at least aluminum, gallium, and indium. The method includes providing a getter at a level of at least 100 ppm with respect to the group III metal source material and providing the group III metal source material and the getter into a chamber. The method also includes transferring a nitrogen-containing material into the chamber and heating the chamber to a determined temperature. In a specific embodiment, the method includes pressurizing the chamber to a determined pressure and processing the nitrogen-containing material with the group III metal source material in the chamber. In one or more embodiments, the method forms a crystalline group III metal nitride characterized by a wurtzite structure substantially free from any cubic entities and an optical absorption coefficient of about 2 cm$^{-1}$ and less at wavelengths between about 405 nanometers and about 750 nanometers.

Still further, the present disclosure provides a gallium nitride containing crystal. The crystal has a crystalline substrate member having a length greater than about 5 millimeters and a substantially wurtzite structure characterized to be substantially free of other crystal structures. In a specific embodiment, the other structures are less than about 1% in volume in reference to a volume of the substantially wurtzite structure. The crystal also has an impurity concentration greater than $10^{15}$ cm$^{-1}$ of at least one of Li, Na, K, Rb, Cs, Ca, F, Br, I, and Cl and an optical absorption coefficient of about 2 cm$^{-1}$ and less at wavelengths between about 405 nanometers and about 750 nanometers.

In certain embodiments, methods of preparing a polycrystalline group III metal nitride material are provided, comprising: providing a source material selected from a group III metal, a group III metal halide, or a combination thereof into a chamber, the source material comprising at least one metal selected from at least aluminum, gallium, and indium; providing a getter at a level of at least 100 ppm with respect to the source material into the chamber such that the getter contacts the g source material; transferring a nitrogen-containing material into the chamber; heating the chamber to a determined temperature; pressurizing the chamber to a determined pressure; processing the nitrogen-containing material with the source material in the chamber; and forming a polycrystalline group III metal nitride material.

In certain embodiments, methods of forming a polycrystalline gallium-containing group III metal nitride material are provided, comprising: providing a gallium-containing group III metal or a group III metal halide source material to a chamber, the gallium-containing group III metal or metal halide source material comprising at least one metal selected from aluminum, gallium, and indium; providing a getter at a level of at least 100 ppm with respect to the source material into the chamber such that the getter contacts the source material; transferring a nitrogen-containing material into the chamber; heating the chamber to a determined temperature; pressurizing the chamber to a determined pressure; processing the nitrogen-containing material with the source material in the chamber to form a polycrystalline gallium-containing group III metal nitride comprising a plurality of grains of a crystalline gallium-containing group III metal nitride; the plurality of grains having an average grain size in a range from about 10 nanometers to about 10 millimeters and defining a plurality of grain boundaries; and the polycrystalline gallium-containing group III metal nitride material having: an atomic fraction of a gallium-containing group III metal in a range from about 0.49 to about 0.55, the gallium-containing group III metal being selected from at least one of aluminum, indium, and gallium; and an oxygen content in the form of a gallium-containing group III metal oxide or a substitutional impurity within the polycrystalline gallium-containing group III metal nitride less than about 10 parts per million (ppm); and a plurality of inclusions within at least one of the plurality of grain boundaries and the plurality of grains, the plurality of inclusions comprising a getter, the getter constituting a distinct phase from the crystalline gallium-containing group III metal nitride and located within individual grains of the crystalline gallium-containing group III metal nitride and/or at the grain boundaries of the crystalline gallium-containing group III metal nitride and being incorporated into the polycrystalline gallium-containing group III metal nitride at a level greater than about 200 parts per million, and; forming a crystalline gallium-containing group III metal nitride crystal from the polycrystalline gallium-containing group III metal nitride characterized by a wurtzite structure substantially free from any cubic entities and an optical absorption coefficient less than or equal to about 2 cm$^{-1}$ at wavelengths between about 405 nanometers and about 750 nanometers.

Benefits are achieved over pre-existing techniques using the present disclosure. In particular, the present disclosure enables a cost-effective manufacture of crystals that serve as a starting material for high quality gallium nitride containing crystal growth. In a specific embodiment, the present method and apparatus can operate with components that are relatively simple and cost effective to manufacture, such as ceramic and steel tubes. A specific embodiment also takes advantage of a getter material suitable for processing one or more chemicals for manufacture of high quality gallium nitride starting material. Depending upon the embodiment, the present apparatus and method can be manufactured using conventional materials and/or methods according to one of ordinary skill in the art. In specific embodiments, the final crystal structure is substantially clear and free of haze and other features that may be undesirable. Depending upon the embodiment, one or more of these benefits may be achieved. These and other benefits may be described throughout the present specification and more particularly below.

The present disclosure achieves these benefits and others in the context of known process technology. However, a further understanding of the nature and advantages implementing embodiments according to the present disclosure may be realized by reference to the latter portions of the specification and attached drawings.

DETAILED DESCRIPTION

Figure 1:
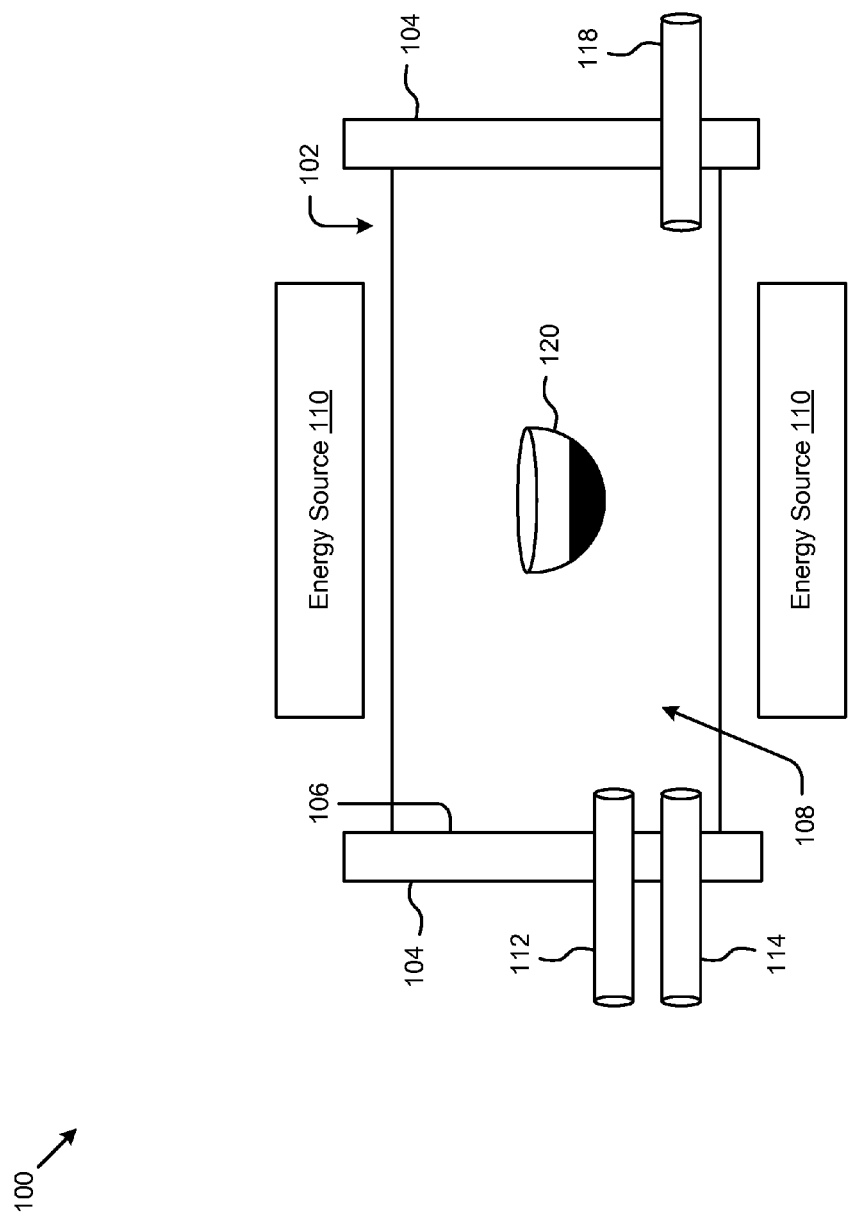
FIGS. 1, 2, and 3 are schematic diagrams illustrating reactors according to embodiments of the present disclosure.

According to the present disclosure, techniques related to processing of materials for growth of crystals are provided. More particularly, the present disclosure provides a crystalline nitride material suitable for use as a raw material for crystal growth of a gallium-containing nitride crystal by an ammonothermal technique, including ammonobasic or ammonoacidic technique, but there can be others. In other embodiments, the present disclosure provides methods suitable for synthesis of polycrystalline nitride materials, but it would be recognized that other crystals and materials can also be processed, including single crystal materials. Such crystals and materials include, but are not limited to, GaN, AN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The disclosure discusses embodiments that may relate to a crystalline composition. The disclosure includes embodiments that may relate to an apparatus for making a crystalline composition. The disclosure includes embodiments that may relate to a method of making and/or using the crystalline composition.

Approximating language, as used herein throughout the specification and claims, may be applied to modify any quantitative representation that could permissibly vary without resulting in a change in the basic function to which it may be related. Accordingly, a value modified by a term such as "about" may not be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

According to one embodiment according to the present disclosure, a composition of a polycrystalline metal nitride is provided. The polycrystalline metal nitride may have a plurality of grains, and these grains may have a columnar structure. In some embodiments, many grains may be bonded or adhered to one another, forming a polycrystalline plate. In other embodiments, a smaller number of grains may be bonded or adhered to one another, forming a polycrystalline powder.

With reference to the grains, the grains may be characterized by one or more properties. The properties may include a grain dimension. Other properties may include an average number of grains per unit volume, an inter-grain bend strength or a tilt angle of the grains relative to each other.

The grain dimension may refer to either an average grain size or an average grain diameter. The grains may have a columnar structure; in this case they have a major axis, and the average grain size refers to an average length of the grains along the major axis. Perpendicular to the major axis may be one or more minor axes, and the average diameter of each grain may be determined with reference to the minor axes. Collectively, the average diameters of each of the grains may be aggregated and averaged to provide the average grain diameter. An average, as used herein, may refer to the mean value.

The average grain size of the polycrystalline metal nitride may be in a range of greater than about 10 nanometers. In one embodiment, the average grain size may be in a range of from about 0.01 micrometer to about 10 millimeters, while in certain other embodiments, the grain size may be in a range of from about 0.01 micrometer to about 30 micrometers, from about 30 micrometers to about 50 micrometers, from about 50 micrometers to about 100 micrometers, from about 100 micrometers to about 500 micrometers, from about 500 micrometers to about 1 millimeter, from about 1 millimeter to about 3 millimeters, from about 3 millimeters to about 10 millimeters or greater than about 10 millimeters. The average grain diameter may be larger than about 10 micrometers. In one embodiment, the average grain diameter may be in a range of from about 10 micrometers to about 20 micrometer, from about 20 micrometers to about 30 micrometers, from about 30 micrometers to about 50 micrometers, from about 50 micrometers to about 100 micrometers, from about 100 micrometers to about 500 micrometers, from about 500 micrometers to about 1 millimeter, from about 1 millimeter to about 3 millimeters, from about 3 millimeters to about 10 millimeters or greater than about 10 millimeters.

An average number of grains per unit volume of the crystalline composition may indicate a grain average or granularity. The composition may have an average number of grains per unit volume of greater than about 100 per cubic centimeter. In one embodiment, the average number of grains per unit volume may be in a range of from about 100 per cubic centimeter to about 1000 per cubic centimeter, from about 1000 per cubic centimeter to about 10,000 per cubic centimeter, from about 10,000 per cubic centimeter to about $10^5$ per cubic centimeter, or greater than about $10^5$ per cubic centimeter.

The grains may be oriented at a determined angle relative to each other. The orientation may be referred to as the tilt angle, which may be greater than about 1 degree. In one embodiment, the grain orientation or tilt angle may be in a range of from about 1 degree to about 3 degrees, from about 3 degrees to about 5 degrees, from about 5 degrees to about 10 degrees, from about 10 degrees to about 15 degrees, from about 15 degrees to about 30 degrees, or greater than about 30 degrees.

Properties that are inherent in or particular to one or more crystalline articles produced according to an embodiment of the present disclosure may include bend strength, density, moisture resistance, and porosity, among others. The properties may be measured using the corresponding ASTM standard test. Example of the ASTM standard test may include ASTM C1499.

The inter-grain bend strength of a film comprising one or more of crystals may be greater than about 20 MegaPascal (MPa). In one embodiment, the inter-grain bend strength may be in a range of from about 20 MegaPascal to about 50 MegaPascal, from about 50 MegaPascal to about 60 MegaPascal, from about 60 MegaPascal to about 70 MegaPascal, from about 70 MegaPascal to about 75 MegaPascal, from about 75 MegaPascal to about 80 MegaPascal, from about 80 MegaPascal to about 90 MegaPascal, or greater than about 90 MegaPascal. The bend strength may indicate the grain to grain relationship at the inter-grain interface and/or the inter-grain strength.

The apparent density of crystalline articles may be greater than about 1 gram per cubic centimeter (g/cc). In one embodiment, the density may be in a range of from about 1 gram per cubic centimeter to about 1.5 grams per cubic centimeter, from about 1.5 grams per cubic centimeter to about 2 grams per cubic centimeter, from about 2 grams per cubic centimeter to about 2.5 grams per cubic centimeter, from about 2.5 grams per cubic centimeter to about 3 grams per cubic centimeter, greater than about 4 grams per cubic centimeter, greater than about 5 grams per cubic centimeter, or greater than about 6 grams per cubic centimeter. The crystalline composition density may be a function of, for example, the porosity or lack thereof, the crystal packing arrangement, and the like.

The crystalline article may be aluminum nitride and may have an apparent density of less than about 3.26 gram per cubic centimeter at standard test conditions. In one embodiment, the aluminum nitride crystalline article may have an apparent density in a range of from about 3.26 gram per cubic centimeter to about 2.93 gram per cubic centimeter, from about 2.93 gram per cubic centimeter to about 2.88 gram per cubic centimeter, from about 2.88 gram per cubic centimeter to about 2.5 gram per cubic centimeter, from about 2.5 gram per cubic centimeter to about 1.96 gram per cubic centimeter, or less than about 1.96 gram per cubic centimeter.

The crystalline article may be gallium nitride and may have an apparent density of less than about 6.2 gram per cubic centimeter at standard test conditions. In one embodiment, the gallium nitride crystalline article may have an apparent density in a range of from about 6.2 gram per cubic centimeter to about 5.49 gram per cubic centimeter, from about 5.49 gram per cubic centimeter to about 4.88 gram per cubic centimeter, from about 4.88 gram per cubic centimeter to about 4.27 gram per cubic centimeter, from about 4.27 gram per cubic centimeter to about 4 gram per cubic centimeter, or less than about 4 gram per cubic centimeter.

The porosity of the polycrystalline composition may be in a range of less than about 30 percent by volume. In one embodiment, the porosity may be in a range of from about 30 percent to about 10 percent, from about 10 percent to about 5 percent, from about 5 percent to about 1 percent, from about 1 percent to about 0.1 percent, or less than about 0.1 percent by volume.

The metal of the metal nitride may include a group III metal. Suitable metals may include one or more of aluminum, gallium, or indium. The "one or more" refers to combination of metals in the metal nitride, and may include compositions such as aluminum gallium nitride (AlGaN), indium gallium nitride (InGaN), aluminum indium nitride (AlInN), aluminum indium gallium nitride (AlInGaN), and the like.

A fraction of the metal, or metals, in the metal nitride may be selected such that there is no excess metal in the metal nitride. In one embodiment, the atomic fraction of the metal may be greater than about 49 percent. In another embodiment, the atomic fraction may be in a range of from about 49 percent to about 50 percent, from about 50 percent to about 51 percent, from about 51 percent to about 53 percent, from about 53 percent to about 55 percent, or greater than about 55 percent.

In some embodiments, the group III metal nitride comprises a powder. The particle size of the powder may be between about 0.1 micron and about 100 microns. Some powder particles may comprise single crystals. Some powder particles may comprise at least two grains. In other embodiments, the group III metal nitride comprises a grit. The particle size of the grit may be between about 100 microns and about 10 millimeters. Some grit particles may comprise single crystals. Some grit particles may comprise at least two grains.

The metal nitride composition may contain one or more impurities. As used herein, and as is commonly used in the art, the term "impurity" refers to a chemical species that is distinct from the group III metal nitride that constitutes the majority composition of the polycrystalline metal nitride. Several classes of impurities may be distinguished, with respect to chemistry, atomic structure, intent, and effect. Impurities will generally comprise elements distinct from nitrogen, aluminum, gallium, and indium, including oxygen, carbon, halogens, hydrogen, alkali metals, alkaline earth metals, transition metals, and main block elements. The impurity may be present in a number of forms, with different atomic structure. In some cases, the impurity is present as an isolated atom or ion within the crystalline lattice of the group III metal nitride, for example, as a substitutional or interstitial impurity. In other cases, the impurity is present in a distinct phase, for example, as an inclusion within an individual group III metal nitride grain or within a grain boundary of the group III metal nitride. The impurity may be deliberately added, to enhance the properties of the group III metal nitride in some way, or may be unintentional. Finally, the impurity may or may not have a significant effect on the electrical, optical, crystallographic, chemical, or mechanical properties of the group III metal nitride. One skilled in the art will recognize that an inclusion comprising, for example, a getter within a crystal grain is distinguished from a dopant in that an inclusion is present as a distinct phase. An inclusion as a distinct phase has a different crystallographic structure than the crystal lattice in which it is embedded whereas a crystal grain having a dopant dispersed within the crystalline lattice of the crystal grain will exhibit a single crystallographic structure.

As used herein, and as is commonly used in the art, the term "dopant" refers to an impurity that is atomically dispersed within the group III metal nitride, for example, as a substitutional or interstitial impurity, and is typically added intentionally. With regard to dopants and dopant precursors (collectively "dopants" unless otherwise indicated), the electrical properties of the group III metal nitride composition may be controlled by adding one or more of such dopants to the above composition during processing. The dopant may also provide magnetic and/or luminescent properties to the group III metal nitride composition. Suitable dopants may include one or more of s or p block elements, transition metal elements, and rare earth elements. Suitable s and p block elements may include, for example, one or more of silicon, germanium, magnesium, or tin. Other suitable dopants may include one or more of transition group elements. Suitable transition group elements may include one or more of, for example, zinc, iron, or cobalt. Suitable dopants may produce an n-type material, a p-type material, or a semi-insulating material. In some embodiments, oxygen, whether added intentionally or unintentionally, also acts as a dopant.

Suitable dopant concentration levels in the polycrystalline composition may be greater than about $10^{10}$ atoms per cubic centimeter. In one embodiment, the dopant concentration may be in a range of from about $10^{10}$ atoms per cubic centimeter to about $10^{15}$ atoms per cubic centimeter, from about $10^{15}$ atoms per cubic centimeter to about $10^{16}$ atoms per cubic centimeter, from about $10^{16}$ atoms per cubic centimeter to about $10^{17}$ atoms per cubic centimeter, from about $10^{17}$ atoms per cubic centimeter to about $10^{18}$ atoms per cubic centimeter, from about $10^{18}$ atoms per cubic centimeter to about $10^{21}$ atoms per cubic centimeter, or greater than about $10^{21}$ atoms per cubic centimeter.

As used herein, the term "getter" refers to a substance that is intentionally added to a process or a composition to remove or react with undesired impurities. The getter has a higher chemical affinity for an undesired impurity, for example, oxygen, than the principal metallic constituent of the composition, for example, gallium. The getter may become incorporated into the polycrystalline group III metal nitride in the form of an inclusion, for example, as a metal nitride, a metal halide, a metal oxide, a metal oxyhalide, or as a metal oxynitride. Examples of suitable getters include the alkaline earth metals, boron, carbon, scandium, titanium, vanadium, chromium, yttrium, zirconium, niobium, the rare earth metals (also known as the lanthanides or the lanthanide metals), hafnium, tantalum, and tungsten, and their nitrides, oxynitrides, oxyhalides, and halides. In some embodiments, an elemental composition or substance can act as either a getter or as a dopant, such as magnesium. In other cases, the getter impurity atom has a larger atomic or covalent diameter than gallium and does not become incorporated as a dopant at sufficient levels to modify the electrical properties of the group III metal nitride significantly, and therefore functions predominantly or exclusively as a getter. The getter may be present in the polycrystalline group III metal nitride as a distinct phase, within individual grains of a crystalline group III metal nitride and/or at grain boundaries of a crystalline group III metal nitride, at a level greater than 100 ppm, from about 100 ppm to about 200 ppm, from about 200 ppm to about 500 ppm, from about 500 ppm to about 0.1%, from about 0.1% to about 0.2%, from about 0.2% to about 0.5%, from about 0.5% to about 2%, from about 2% to about 10%, or greater than 10%. Parts per million (ppm) and "%" refer to "by weight" unless otherwise indicated.

In other cases, impurities are unintended and/or undesirable inclusions in the polycrystalline group III metal nitride, and may result from, for example, processing and handling. Other unintentional impurities may result from contaminants in raw materials. Some unintentional impurities may be more closely associated with select raw materials. In some embodiments, the unintentional impurity includes oxygen present as a substitutional impurity, or dopant, in the polycrystalline group III metal nitride at higher than the desired level. In other embodiments, the unintentional impurity includes oxygen present as a group III oxide inclusion, for example, $Ga_2O_3$, $Al_2O_3$, and/or $In_2O_3$. The unintentional oxygen impurity may originate from residual oxygen in the metal raw material, from moisture or $O_2$ present as an impurity in the gaseous raw materials used in the synthesis process, from moisture or $O_2$ generated from outgassing of the reactor components during the synthesis process, from reaction of the gaseous raw materials with one or more of the reactor materials during the synthesis process, or from an air leak in the reactor. In one embodiment, the oxygen content present as $Ga_2O_3$ or as a substitutional impurity within the polycrystalline group III metal nitride may be less than about 10 parts per million (ppm). In another embodiment, the oxygen content present as $Ga_2O_3$ or as a substitutional impurity within the polycrystalline gallium nitride may be in a range of from about 10 parts per million to about 3 parts per million, from about 3 parts per million to about 1 part per million, from about 1 part per million to about 0.3 parts per million, from about 0.3 part per million to about 0.1 parts per million, or less than about 0.1 part per million.

Getters are often used to purify the gases being used to synthesize polycrystalline gallium-containing group III nitride materials. However in these uses, the incorporation of the getter into the polycrystalline material is avoided. In contrast, it is an object of the invention to deliberately incorporate a getter phase into the polycrystalline group III nitride materials so formed. In some embodiments according to the present disclosure, a getter material is provided in a crucible along with a group III metal. In other embodiments, a getter material is provided to a chamber in which a group III metal or a group III metal halide is to be processed. In some embodiments according to the present disclosure, a getter material is provided in a separate crucible or source from the group III metal crucible and transported to a crucible where a group III metal is to be processed. In some embodiments, a getter material is provided in a separate crucible or source from the group III metal and transported to a region wherein a polycrystalline group III nitride material is formed. In some embodiments, the getter material, or a distinct phase comprising at least one component of the getter material, is incorporated into the polycrystalline group III metal nitride as an inclusion within or between grains of crystalline group III metal nitride. In other embodiments, the getter removes impurities from the growth environment in the gas phase and does not become incorporated into the polycrystalline group III metal nitride. In some embodiments, the getter removes impurities from the growth environment by forming a solid compound that does not become incorporated into the polycrystalline group III metal nitride.

Referring now to the apparatus that includes an embodiment according to the present disclosure, the apparatus may include sub systems, such as a housing, one or more supply sources, and a control system.

The housing may include one or more walls, components, and the like. The walls of the housing may be made of at least one of a metal, a refractory material, or a metal oxide. In one embodiment, the walls of the housing comprise at least one of fused silica, alumina, carbon, iron-based alloy, chromium-based alloy, molybdenum, molybdenum-based alloy, or boron nitride. In one embodiment, the housing may have an inner wall, and an outer wall spaced from the inner wall. An inner surface of the inner wall may define a chamber.

The walls of the housing may be configured (e.g., shaped or sized) with reference to processing conditions and the desired end use. The configuration may depend on the size and number of components, and the relative positioning of those components, in the chamber. The chamber may have a pre-determined volume. In one embodiment, the housing may be a rectangular cuboid. In one embodiment, the housing may be cylindrical with an outer diameter in a range of from about 5 centimeters to about 1 meter, and a length of from about 20 centimeters to about 10 meters. The housing may be elongated horizontally, or vertically. The orientation of the elongation may affect one or more processing parameters. For example and as discussed in further detail below, for a horizontal arrangement, a series of crucibles may be arranged in a series such that a stream of reactants flow over the crucibles one after another. In such an arrangement, the concentration and composition of the reactant stream may differ at the first crucible in the series relative to the last crucible in the series. Of course, such an issue may be addressed with such configuration changes as rearrangement of the crucibles, redirection of the reactant stream(s), multiple reactant stream inlets, and the like.

A liner may be disposed on the inner surface of the inner wall along the periphery of the chamber. Suitable liner material may include graphite, boron nitride, metal, or graphite coated with a material such as TaC, SiC or pyrolytic boron nitride. The liner and other inner surfaces may not be a source of undesirable contaminants. The liner may prevent or reduce material deposition on the inner surface of the inner wall. The liner may prevent or reduce etching of the walls of the housing by halides of getter metals. Failing the prevention of material deposition, the liner may be removable so as to allow the deposited material to be stripped from the inner wall during a cleaning process and/or replacement of the liner. In another embodiment, the housing may contain an outer wall and an inner wall, and the inner wall may comprise graphite, boron nitride, metal, or graphite coated with a material such as TaC, SiC or pyrolytic boron nitride and may possess one or more of the benefits described above for the liner.

Because the inner wall may be concentric to and spaced from the outer wall, the space may define a pathway between the inner wall and the outer wall for environmental control fluid to flow therethrough. Suitable environmental control fluids that may be used for circulation may include inert gases. Environmental control fluid may include gas, liquid or supercritical fluid. An environmental control inlet may extend through the outer wall to the space. A valve may block the environmental control fluid from flowing through the inlet and into the pathway to circulate between the inner and outer walls. In one embodiment, the inlet may be part of a circulation system, which may heat and/or cool the environmental control fluid and may provide a motive force for the fluid. The circulation system may communicate with, and respond to, the control system. Flanges, such as those meant for use in vacuum systems, may provide a leak proof connection for the inlet.

Suitable components of the housing may include, for example, one or more inlets (such as raw material inlets, gas inlets, carrier gas inlets, and dopant inlets), one or more outlets, filters, heating elements, cold walls, hot walls, pressure responsive structures, crucibles, baffles, and sensors. Some of the components may couple to one or more of the walls, and some may extend through the walls to communicate with the chamber, even while the housing is otherwise sealed. The inlets and the outlet may further include valves.

The inlets and the outlet may be made from one or more materials suitable for semiconductor manufacturing, such as electro-polished stainless steel materials, corrosion-resistant metal alloys (such as Hastelloy™), quartz, or refractory materials. The inlets and/or outlets may be welded or fused to the respective wall, or may be secured to the wall by one or more metal-to-metal, quartz-to-quartz, or metal-to-quartz seals. The inlets may extend into a hot zone in the chamber. Accordingly, the inlets may be composed of multiple materials wherein different materials are used in different regions of the reactor (or chamber). Different inlet materials may be chosen based on the temperature of the region and the chemical exposure. In one embodiment, a hot zone of the chamber may have inlets that comprise graphite, molybdenum, tungsten, or rhenium or one or more of an oxide, a nitride, or an oxynitride of silicon, aluminum, magnesium, boron, or zirconium. In a specific embodiment, the one or more inlets in a hot zone may comprise a non-oxide material, such as boron nitride, silicon carbide, tantalum carbide, or a carbon material such as graphite. Optionally, the inlets and/or outlets may include purifiers. In one embodiment, the purifier includes a getter material that does not become incorporated into the inlet gas stream, for example a zirconium alloy which may react with contaminants in the inlet gas stream to form non-volatile nitrides, oxides and carbides, thus reducing the probability of contamination in the final product. In one embodiment, the purifiers may be placed in the inlets at the entrance to the chamber. For reactions utilizing large quantities of ammonia the main concern for contamination may be the presence of water due to hygroscopic nature of ammonia. The contamination of ammonia drawn from an ammonia tank may increase exponentially as the ammonia tank empties and when 70 percent of ammonia is reached, the tank may be replaced. Alternatively, a point-of-use purifier may be utilized at the inlets. The use of a point-of-use purifier may help in controlling the contamination in ammonia thereby reducing ammonia wastage. Optionally, lower grade ammonia may be utilized along with the point-of-use purifier to obtain a grade of about 99.9999 percent.

The shape or structure of the one or more inlets and outlets may be modified to affect and control the flow of fluid therethrough. For example, an inner surface of the inlet/outlet may be rifled. The rifling may spin the gas flowing out through the ends and enhance mixing. In one embodiment, the inlets may be coupled together such that the reactants may pre-mix before they reach a reaction zone or a hot zone. Each of the inlets and outlets may have an inner surface that defines an aperture through which material can flow into, or out of, the chamber. Valve apertures may be adjustable from fully open to fully closed thereby allowing control of the fluid flow through the inlets and the outlets.

The inlet(s) may be configured to promote mixing of the nitrogen-containing gas and the halide-containing gas upstream of the crucible(s), so as to promote uniform process conditions throughout the volume of the chamber. One or more of the inlets may contain one or more of baffles, apertures, fits, and the like, in order to promote mixing. The apertures, frits, and baffles may be placed within the chamber proximate to the hot zone or crucibles so as to control the flow of gas in the chamber, which may prevent or minimize the formation of solid ammonium halide. The apertures, frits, and baffles may be placed upstream of the nearest crucible, with a distance of separation that is in a range from about 2 cm to about 100 cm, in order for mixing to be complete prior to the onset of reaction with the contents of the crucible. The presence of apertures and baffles may promote higher gas velocities that promote mixing and inhibit back-flow of gases, preventing or minimizing the formation of solid ammonium halide. Furthermore, the inlet(s) may be configured to extend into a hot zone or a reaction zone.

One or more crucibles may be placed within the chamber. In one embodiment, the number of crucibles within the chamber is about 6. Depending on the configuration of the chamber, the crucibles may be arranged horizontally and/or vertically within the chamber. The crucible shape and size may be pre-determined based on the end usage of the metal nitride, the raw material types, and the processing conditions. For the polycrystalline composition to be useful as a sputter target, the size of the crucible may be relatively larger than the required size of the sputter target. The excess of the polycrystalline composition may be removed, for example, through etching or cutting to form the sputter target article. Such removal may eliminate surface contamination resulting from contact with the crucible material.

The crucible may withstand temperatures in excess of the temperature required for crystalline composition formation while maintaining structural integrity, and chemical inertness. Such temperatures may be greater than about 200 degree Celsius, in a range of from about 200 degree Celsius to about 1300 degree Celsius, or greater than about 1300 degrees Celsius. Accordingly, refractory materials may be suitable for use in the crucible. In one embodiment, the crucible may include a refractory composition including an oxide, a nitride, or an oxynitride. The crucible may be formed from one or more of graphite, molybdenum, tungsten, or rhenium or from one or more of an oxide, a nitride, or an oxynitride of silicon, aluminum, magnesium, boron, or zirconium. In a specific embodiment, the crucible comprises a non-oxide material, such as boron nitride, silicon carbide, tantalum carbide, or a carbon material such as graphite. In one embodiment, a removable liner may be placed inside the crucible so as to facilitate easy removal of a raw material and/or polycrystalline composition. The removable liner may be formed of graphite or boron nitride. In some embodiments, a getter is added to the crucible in the form of a foil or liner. In one specific embodiment, the getter foil or liner is chosen from at least one of zirconium, hathium, and tantalum. In another embodiment, the crucible composition comprises at least one getter.

A quantity of group III metal, comprising at least one of aluminum, gallium, and indium, may be placed in at least one crucible. The group III metal may be added in solid or liquid form. A getter, comprising at least one of the alkaline earth metals, boron, carbon, scandium, titanium, vanadium, chromium, yttrium, zirconium, niobium, the rare earth metals, hafnium, tantalum, and tungsten, may also be placed in the at least one crucible along with the group III metal. In another embodiment, a getter, comprising at least one of the alkaline earth metals, boron, carbon, scandium, titanium, vanadium, chromium, yttrium, zirconium, niobium, the rare earth metals, hafnium, tantalum, and tungsten, may be placed in one more separate crucibles that optionally do not contain a group III metal. The getter may be added at a level greater than 100 ppm, greater than 300 ppm, greater than 0.1%, greater than 0.3%, greater than 1%, greater than 3%, or greater than 10% by weight with respect to the group III metal within the chamber. The getter may be added in the form of a solid, including as a powder, grit, pellet, wire, or foil. The getter may be added in the form of a metal, a nitride, a halide, or a mixture or compound thereof. The getter may contain oxygen. In another embodiment, the group III metal, comprising at least one of aluminum, gallium, and indium, may be introduced into the chamber in a gaseous form, for example, in the form of a metal halide.

In one embodiment, at least one wetting agent is also added to the crucible, contacting the group III metal. As used herein, "wetting agent" refers to an element or a compound that facilitates the mixing of or a reaction between an otherwise immiscible liquid mixture at the interface of the two components. The wetting agent can be any metal that facilitates interfacial wetting of a binary liquid metal mixture and does not readily react to form covalent bonds with a Group III element. Any suitable and effective wetting agent compound can be employed. Suitable wetting agents include bismuth (Bi), lead (Pb), germanium (Ge), and tin (Sn). Other suitable wetting agents include antimony (Sb), tellurium (Te), and polonium (Po). The reaction mixture can also include a mixture of two or more wetting agents, in any proportion. The reaction mixture can include a wetting agent compound, such as organometallic compounds containing the wetting agent metal or inorganic compounds containing the wetting agent metal. Suitable wetting agent compounds include, e.g., halides, oxides, hydroxides, and nitrates. Many suitable and effective wetting agents and wetting agent compounds are disclosed, e.g., in Aldrich Handbook of Fine Chemicals, 2003-2004 (Milwaukee, Wis.). As used herein, bismuth, germanium, tin, and lead refer to elemental metals, alloys containing these metals, compounds containing these metals, and mixtures thereof. The Group III metal and the wetting agent can be present in a molar ratio of about 1:1 to about 500:1. Specifically, the Group III element and the wetting agent can be present in a molar ratio of about 2:1, about 5:1, about 20:1, about 100: 1, or about 200:1.

In certain embodiments, a group III metal is provided to the chamber in the form of a halide, for example, as one or more of $GaCl_3$, $GaCl$, $AlCl_3$, or $InCl_3$. The group III metal halide may be generated by passing a halogen-containing gas, for example, hydrogen chloride or chlorine, over a crucible containing at least one group III metal and placed within a second chamber which is placed upstream of the chamber in which the polycrystalline group III metal nitride is synthesized.

One or more substrates or surfaces may be placed downstream of a crucible containing a group III metal or of an inlet from which a group III metal halide is provided, that is, between the group III metal source and the outlet of the chamber. The one or more substrates or surfaces may be formed from one or more of graphite, molybdenum, tungsten, or rhenium or from one or more of an oxide, a nitride, or an oxynitride of silicon, aluminum, magnesium, boron, or zirconium. In a specific embodiment, the one or more substrates or surfaces comprises a non-oxide material, such as boron nitride, silicon carbide, tantalum carbide, or a carbon material such as graphite. The substrates or surfaces may comprise flat disks, rods, tubes, cones, annular segments, conical sections, crucibles, or the like. The one or more substrates or surfaces may serve as a location for formation of a polycrystalline group III metal nitride. In one embodiment, the substrates or surfaces may further contain polycrystalline group III nitride which may serve as a location or seed for growth during the growth process, for example, in the form of a powder, a film, or adherent particles.

Suitable sensors may include one or more of pressure sensors, temperature sensors, and gas composition sensors. The sensors may be placed within the chamber, within the outlet(s), and/or within the inlet(s), and may communicate the process parameters in the chamber to the control system.

Suitable supply sources may include one or more of an energy source, a nitrogen-containing gas source, a carrier gas source, a getter gas source, a halide-containing gas source, a raw material source (sometimes referred to as a reservoir), a dopant gas source, environmental control fluid source, and the like.

The energy source may be located proximate to the housing and may supply energy, such as thermal energy, plasma energy, or ionizing energy to the chamber through the walls. The energy source may be present in addition to, or in place of, the heating elements disclosed above. In one embodiment, the energy source may extend along an outward facing surface of the outer wall of the housing. The energy source may provide energy to the chamber. In one embodiment, the energy source may be within the housing and supply energy, such as thermal energy, plasma energy, or ionizing energy to the crucible(s) and reaction region. The energy source may be present in addition to, or in place of, the heating elements disclosed above. In one embodiment, the energy source may extend above, below, or beside the crucible(s) and reaction region. The energy source may provide energy to the chamber. Multiple energy sources may be applied to supply energy. In one embodiment, the multiple energy sources may permit controllable heating of a crucible within the chamber to a particular temperature and heating of a reaction region to a different temperature. In one embodiment, two or more crucibles within the chamber may be heated to a different temperature.

The energy source may be a microwave energy source, a thermal energy source, a plasma source, or a laser source. In one embodiment, the thermal energy may be provided by a heater. Suitable heaters may include one or more molybdenum heaters, tube furnaces, split furnace heaters, three-zone split furnaces, graphite heaters, or induction heaters.

Sensors may be placed within the chamber. The sensors may be capable of withstanding high temperature and elevated or reduced pressure in the chamber and may be chemically inert. The sensors may be placed proximate to the crucible, and/or may be placed at the inlet(s), outlet(s), or another location within the housing. The sensors may monitor process conditions such as the temperature, pressure, gas composition and concentration within the chamber.

The nitrogen-containing gas source may communicate through a first inlet with the chamber. The nitrogen-containing gas source may include one or more filters, purifiers, or driers to purify and/or dry the nitrogen-containing gas. In one embodiment, the nitrogen-containing gas may be produced at the source. The purifier may be able to maintain purity levels of the nitrogen-containing gas up to or above semiconductor grade standards for purity. Suitable nitrogen-containing gases may include ammonia, diatomic nitrogen, and the like. Where the presence of carbon is not problematic, nitrogen-containing organics may be used.

Controlling the aperture of the associated valve allows control of the flow rate of the nitrogen-containing gas into the chamber. Unless otherwise specified, flow rate will refer to volumetric flow rate. Processing considerations, sample size, and the like may determine an appropriate flow rate of the gas. The flow rate of nitrogen-containing gas may be greater than about 10 (standard) cubic centimeters per minute. In one embodiment, the flow rate of nitrogen-containing gas may be in a range of from about 10 cubic centimeters per minute to about 100 cubic centimeters per minute, from about 100 cubic centimeters per minute to about 200 cubic centimeters per minute, from about 200 cubic centimeters per minute to about 500 cubic centimeters per minute, from about 500 cubic centimeters per minute to about 1200 cubic centimeters per minute, from about 1200 cubic centimeters per minute to about 2000 cubic centimeters per minute, from about 2000 cubic centimeters per minute to about 3000 cubic centimeters per minute, from about 3000 cubic centimeters per minute to about 4000 cubic centimeters per minute, from about 4000 cubic centimeters per minute to about 5000 cubic centimeters per minute, from about 5 standard liters per minute to about 10 standard liters per minute, from about 10 standard liters per minute to about 20 standard liters per minute, from about 20 standard liters per minute to about 50 standard liters per minute, or greater than about 50 standard liters per minute. In some embodiments, the flow of the nitrogen-containing gas in units of volume per second is chosen to be greater than 1.5 times the volume of the group III metal. In some embodiments, the flow of the nitrogen-containing gas is supplied at a gas flow velocity of at least 0.1 centimeters per second on the surface of the group III metal, at a reaction temperature of at least 700 degrees Celsius and no greater than 1300 degrees Celsius. In some embodiments, the flow of the nitrogen-containing gas is supplied at a gas flow velocity of at least 0.1 centimeters per second and combines with a gaseous source of the group III metal, for example GaCl, at a reaction temperature of at least 700 degrees Celsius and no greater than 1,300 degrees Celsius.

The carrier gas source may communicate with the chamber through an inlet, and/or may share the first inlet with the nitrogen-containing gas. Pre-mixing the nitrogen-containing gas with at least one carrier gas may dilute the nitrogen-containing gas to a determined level. Because the nitrogen-containing gas may be diluted with a carrier gas, which may be inert, the likelihood of formation of certain halide solids proximate to the first inlet in the chamber may be reduced. The dilution of the nitrogen-containing gas with a carrier gas may also serve to achieve a desired gas velocity through an inlet or an orifice or tube. Suitable carrier gases may include one or more of argon, helium, nitrogen, hydrogen, or other inert gases. In one embodiment, the carrier gas inlet is positioned so that a stream of carrier gas may impinge on a stream of nitrogen-containing gas exiting the first inlet. Dopants may be entrained in the carrier gas, in one embodiment, for inclusion in the polycrystalline composition.

A halide-containing gas source may communicate through a second inlet with the chamber. As with the nitrogen-containing gas source, the halide-containing gas source may include one or more filters, purifiers, driers, and the like, so that the halide-containing gas be purified and/or dried at the source. The halide-containing gas may be produced at the source. Suitable halide-containing gases may include hydrogen chloride, chlorine gas, and the like. In some embodiments, the halide-containing gas is omitted from the process.

Controlling the aperture of the associated valve allows control of the flow rate of the halide-containing gas into the chamber. Processing considerations, sample size, and the like, may determine an appropriate flow rate of the gas. The flow rate of halide-containing gas may be greater than about 10 (standard) cubic centimeters per minute. In one embodiment, the flow rate of halide-containing gas may be in a range of from about 10 cubic centimeters per minute to about 50 cubic centimeters per minute, from about 50 cubic centimeters per minute to about 100 cubic centimeters per minute, from about 100 cubic centimeters per minute to about 250 cubic centimeters per minute, from about 250 cubic centimeters per minute to about 500 cubic centimeters per minute, from about 500 cubic centimeters per minute to about 600 cubic centimeters per minute, from about 600 cubic centimeters per minute to about 750 cubic centimeters per minute, from about 750 cubic centimeters per minute to about 1000 cubic centimeters per minute, from about 1000 cubic centimeters per minute to about 1200 cubic centimeters per minute, or greater than about 1200 cubic centimeters per minute.

The halide-containing gas may flow into the chamber from the halide-containing gas source through a second inlet. As with the nitrogen-containing gas, the halide-containing gas may be pre-mixed with at least one carrier gas to dilute the halide-containing gas to a determined level. The dilution of the halide-containing gas with an inert, carrier gas may reduce the likelihood of formation of certain halide solids in the second inlet, proximate to the chamber. Such a formation might reduce or block the flow therethrough. The dilution of the halide-containing gas with an inert, carrier gas may also serve to achieve a desired gas velocity through a second inlet, orifice, or tube. Optionally, the carrier gas inlet may be positioned such that a stream of carrier gas may impinge on a stream of halide-containing gas exiting a second inlet or entering the chamber. In one embodiment, dopants may be entrained in the carrier gas for inclusion in the polycrystalline composition.

The halide-containing gas and the nitrogen-containing gas may be introduced into the chamber in a manner that determines properties of the polycrystalline composition. The manner may include simultaneous introduction at a full flow rate of each component fluid (gas, liquid, or supercritical fluid). Other suitable introduction manners may include pulsing one or more of the components, varying the concentration and/or flow rate of one or more components, or staggered introductions, for example, to purge the chamber with carrier gas.

The halide-containing gas and the nitrogen-containing gas inlets may be disposed such that the exit end is located in the hot zone in the chamber. In one embodiment, one or more inlets are located in a region of the chamber that, during use, has a temperature of greater than about 250 degree Celsius at 1 atmosphere, or a temperature in a range of from about 250 degree Celsius to about 370 degree Celsius, or greater than about 370 degrees Celsius.

The ratio of flow rate of the nitrogen-containing gas to the flow rate of the halide-containing gas may be adjusted to optimize the reaction. In one embodiment, the ratio of flow rate of the nitrogen-containing gas to the flow rate of halide-containing gas may be in a range of greater than 30:1, from about 30:1 to about 15:1, from about 15:1 to about 1:1, from about 1:1 to about 1:10, or from about 1:10 to about 1:15.

In certain embodiments, a getter is provided to the chamber in the vapor phase. In a specific embodiment, a metal is provided in an inlet for a halide-containing gas in a region that has an elevated temperature under operating conditions. In one embodiment, the metal may react with the halide-containing gas to form a volatile metal halide, which is transported into the chamber and contacts the group III metal. In another embodiment, the metal may reside in the chamber and react with a halide-containing gas to form a volatile metal halide, which is transported to another part of the chamber. In one embodiment, the metal halide is transported to the reaction zone where it combines with the nitrogen-containing gas and a halide-containing gas that contains a group III metal source. In another embodiment, the getter is provided directly as a compound, for example, as a halide or as a hydride. In certain embodiments, the chemical species formed by reaction of the getter with an undesired impurity, for example, oxygen, is volatile under operating conditions and is carried away out of the chamber. In a specific embodiment, the getter is selected from one of a hydrocarbon ($C_wH_y$, where w, y>0), such as methane ($CH_4$) or acetylene ($C_2H_2$), a halocarbon $C_wX_z$, where w, z>0 and X =F, Cl, Br, or I), such as $CCl_4$, a halohydrocarbon ($C_wH_yX_z$, where w, y, z>0 and X=F, Cl, Br, or I), such as chloroform ($CHCl_3$) or methylene chloride ($CH_2Cl_2$), phosgene ($COCl_2$), thionyl chloride ($SOCl_2$), boron trichloride ($BCl_3$), diborane ($B_2H_6$), and hydrogen sulfide ($H_2S$). In certain embodiments, the chemical species formed by reaction of the getter with an undesired impurity, for example, oxygen, is non-volatile under operating conditions and remains at the mixing or contact point, which may be at a different region than the polycrystalline composition.

A raw material source may communicate through a raw material inlet and into the crucible, which is in the chamber. As with the other sources, a raw material source may include one or more filters, driers, and/or purifiers. Particularly with reference to a raw material source, purity of the supplied material may have a disproportionately large impact or effect on the properties of the final polycrystalline composition. A raw material may be produced just prior to use and may be kept in an inert environment to minimize or eliminate contamination associated with atmospheric contact. If, for example, hygroscopic materials are used, or materials that readily form oxides, then a raw material may be processed and/or stored such that the raw material does not contact moisture or oxygen. Further, because the raw material can be melted and flowed into the chamber during processing, in one embodiment, differing materials may be used in a continuous process than might be available for use relative to a batch process. At least some of such differences are disclosed herein below.

Suitable raw materials may include one or more of gallium, indium, or aluminum. In one embodiment, the raw material may have a purity of 99.9999 percent or greater. In another embodiment, the purity may be greater than about 99.99999 percent. The raw material may be a gas; a liquid solution, suspension or slurry; or a molten liquid. The residual oxygen in a raw material, particularly a metal, may further be reduced by heating under a reducing atmosphere, such as one containing hydrogen, or under vacuum.

In certain embodiments, one or more crucibles and/or raw materials are loaded into the chamber from a glove box, dry box, desiccator, or other inert atmosphere environment. In certain embodiments, a polycrystalline group III metal nitride is removed from the chamber following a synthesis run directly into a glove box, dry box, desiccator, or other inert atmosphere environment. For convenience, an inert atmosphere may generally be referred to as a glove box for the purposes of this document.

While all of the materials needed for production may be sealed in the chamber during operation in one embodiment; in another embodiment, various materials may be added during the process. For example, a raw material may flow through a raw material inlet, out of an exit end, and into a crucible within the chamber. Where there is a plurality of crucibles, multiple raw material inlets, or one inlet having multiple exit ends, may be used to flow raw material into individual crucibles. In one embodiment, a raw material inlet may be mounted on a linear motion feed-through structure. Such feed-through structures may allow the translation of the exit end of a raw material inlet from crucible to crucible.

The flow and the flow rate of raw material to, and through, a raw material inlet may be controlled by a valve. The valve may be responsive to control signals from the control system. While the flow rate of a raw material may be determined based on application specific parameters, suitable flow rates may be larger than about 0.1 kilogram per hour. In one embodiment, the flow rate may be in a range of from about 0.1 kilogram per hour to about 1 kilogram per hour, from about 1 kilogram per hour to about 5 kilograms per hour, or greater than about 5 kilograms per hour.

A dopant inlet may be in communication with a reservoir containing dopants and the chamber. The reservoir may be made of material compliant to semiconductor grade standards. The reservoir may have provisions to purify/dry the dopants. In one embodiment, the reservoir may have liners. The liners may prevent corrosion of the reservoir material, or reduce the likelihood of contamination of the dopants by the reservoir.

A dopant source may be separate, or may be co-located with one or more of the other materials being added during processing. If added separately, the dopants may flow directly into a crucible by exiting an end of the dopant inlet. As mentioned, the dopant may be introduced by pre-mixing with, for example, a raw material, a carrier gas, a halide-containing gas, or a nitrogen-containing gas. Metering of the dopant may control the dopant concentration levels in the polycrystalline composition. Similarly, the placement of the dopant in the polycrystalline composition may be obtained by, for example, pulsing, cycling, or timing the addition of the dopant.

Suitable dopants may include dopant precursors. For example, silicon may be introduced as $SiCl_4$ $SiH_4$, or $Si_2H_6$, and germanium may be introduced as $GeCl_4$ or $GeH_4$. Where carbon is a desired dopant, carbon may be introduced as a hydrocarbon, such as methane, methylene chloride, or carbon tetrachloride. Suitable dopants may include a halide or a hydride. In situations where carbon is a desired dopant, or an inconsequential contaminant, metals may be introduced as an organometallic compound. For example, magnesium may be introduced as $Mg(C_5H_5)_2$, zinc as $Zn(CH_3)_2$, and iron as $Fe(C_5H_5)_2$. The flow rate of dopant precursors may be greater than about 10 (standard) cubic centimeters per minute. In one embodiment, the flow rate of the dopant precursors may be in a range of from about 10 cubic centimeters per minute to about 100 cubic centimeters per minute, from about 100 cubic centimeters per minute to about 500 cubic centimeters per minute, from about 500 cubic centimeters per minute to about 750 cubic centimeters per minute, from about 750 cubic centimeters per minute to about 1200 cubic centimeters per minute, or greater than about 1200 cubic centimeters per minute. Alternatively, the dopant may be added in elemental form, for example, as an alloy with the raw material or in a separate crucible. Other suitable dopants may comprise one or more of Si, O, Ge, Be, Mg, Zn, Sc, Ti, V, Cr, Mn, Fe, Co, Ni, Cu, Y, Zr, Mo, Sn, Ce, Pr, Nd, Pm, Sm, Eu, Dy, Er, Tm, Yb, or Hf.

The one or more outlets, and corresponding valves, may control the release of material that is inside of the chamber. The released material may be vented to atmosphere, or may be captured, for example, to recycle the material. The released material may be monitored for composition and/or temperature by an appropriate sensor mounted to the outlet. The sensor may signal information to the control system. Because contamination may be reduced by controlling the flow of material through the chamber in one direction, the polycrystalline composition may be removed from the chamber by an exit structure in the wall at the outlet side.

An outlet may be coupled to an evacuation system. The evacuation system may be capable of forming a low base pressure or a pressure differential in the chamber relative to the atmospheric pressure. Suitable base pressure may be lower than about $10^{-7}$ millibar. In one embodiment, the base pressure may be in a range of from about $10^{-7}$ millibar to about $10^{-5}$ millibar, or greater than about $10^{-5}$ millibar. In one embodiment, the pressure differential may be in a range of from about 760 Torr to about 50 Torr, 50 Torr to about 1 Torr, from about 1 Torr to about $10^{-3}$ Ton, from about $10^{-3}$ Ton to about $10^{-5}$ Ton, or less than about $10^{-5}$ Ton. The evacuation may be used for pre-cleaning, or may be used during processing.

An outlet may be heated to a temperature, which may be maintained, that is greater than the temperature where the vapor pressure of an ammonium halide that might be formed during processing is greater than the process pressure, for example, one bar. By maintaining a temperature above the sublimation point of ammonium halide at the reactor pressure, the ammonium halide might flow into a trap or may be precluded from forming or solidifying near the outlet once formed.

The control system may include a controller, a processor in communication with the controller, and a wired or wireless communication system that allows the controller to communicate with sensors, valves, sources, monitoring and evaluating equipment, and the like.

The sensors within the chamber may sense conditions within the chamber, such as the temperature, pressure, and/or gas concentration and composition, and may signal information to the controller. Flow rate monitors may signal information about the flow rate through the corresponding inlet or outlet to the controller. The controller (via the processor) may respond to the information received, and may control devices in response to the information and pre-determined instruction parameters. For example, the controller may signal the energy source to provide thermal energy to the chamber. The controller may signal one or more valves to open, close, or open to a determined flow level during the course of polycrystalline composition synthesis. The controller may be programmed to implement a method of growing polycrystalline compositions.

The resultant polycrystalline composition may be a group III metal nitride. The metal nitride may be doped to obtain one or more of an n-doped or a p-doped composition. The metal nitride may be a metallic, semiconducting, semi-insulating or insulating material. Further, each of these compositions may be a magnetic or a luminescent material.

The working of the apparatus and the function of the various components are described below with reference to illustrated embodiments. Referring to the drawings, the illustrations describe certain illustrative embodiments and do not limit the scope of the claims.

An apparatus 100 in accordance with an embodiment is shown in FIG. 1. The apparatus 100 may be used for preparing a metal nitride material, and may include a housing 102 having a wall 104. The wall 104 may have an inner surface 106 that defines a chamber 108. An energy source 110 may be located proximate to the wall 104. A first inlet 112 and a second inlet 114 extend through the wall 104. The inlets 112, 114 define apertures through which material can flow into, or out of, the chamber 108. An outlet 118 extends through the wall 104 to the chamber 108. A crucible 120 may be disposed in the chamber 108. A liner (not shown) may line the inner surface 106 of the wall 104.

The energy source 110 may be a thermal energy source, such as a ceramic heater. The inlets 112, 114 and the outlet 118 may be electro-polished stainless steel suitable for semiconductor grade manufacturing. In a specific embodiment, the crucible 120 may comprise boron nitride, and the liner may comprise graphite.

During operation, a group III metal raw material and a getter may be filled into the crucible 120, and the crucible may be pre-loaded into the chamber. One or more dopants may be placed in the crucible with the raw material. After loading, the crucible 120 may be sealed by a sealing mechanism (not shown).

A nitrogen-containing gas may flow through the first inlet 112 into the chamber 108. The nitrogen-containing gas may include ammonia, and may include a carrier gas for predilution. A halide-containing gas may flow through the second inlet 114 and into the chamber 108. The halide-containing gas may include hydrogen chloride and/or chlorine. The halide-containing gas may be pre-diluted with a carrier gas. Unreacted gases and/or other waste materials may be removed from the chamber 108 through the outlet 118. The chamber 108 may be purged by flowing in gases through the inlets 112, 114 and out through the outlet 118 prior to crystalline composition formation. The outflow, optionally, may be monitored to detect the impurity level of the out-flowing gas, which may indicate when a sufficient purge has been achieved.

The energy source 110 may be activated. Activating the energy source 110 may increase the temperature within the chamber 108 to pre-determined level and at a pre-determined rate of temperature increase. An area, within the chamber 108 and proximate to the crucible 120, may define a hot zone or reaction zone (not shown).

The raw material, already in the crucible 120, may respond to contact with the nitrogen-containing gas in the presence of the halide-containing gas, and at the determined temperature, by reacting to form a nitride of the metal, that is, the polycrystalline composition.

We believe that the group III metal reacts with a hydrogen halide or halogen to form a volatile group III metal halide. The group III metal halide in turn reacts with the nitrogen-containing gas, for example, ammonia, to form a polycrystalline group III metal nitride. Under typical processing conditions, most of the group III metal may react to form a polycrystalline group III metal nitride and only a small fraction of the group III metal may be transported away from the crucible in the form of a group III metal halide. Under typical reaction conditions, some, most, or all of the getter may be dissolved in the liquid group III metal when the getter is placed within the same crucible as the group III metal. Many of the getters disclosed above are broadly miscible in liquid aluminum, gallium, and indium at temperatures above 500-1300 degrees Celsius. Even the refractory metals Zr, Hf, and Ta are soluble at a level above about 1-2% in gallium at 1300 degrees Celsius. The dissolved getter metal may become well mixed within the molten group III metal. The dissolved getter metal may react with dissolved oxygen within the molten group III metal, forming an oxide of the getter metal. Like the group III metal, the getter metal may form halides and/or nitrides. At temperatures of about 500 to 1300 degrees Celsius, the getter metal halides are relatively volatile and the getter metal nitrides, oxides, and oxynitrides are generally not volatile. In the case of some getters, for example, the alkaline earth metals and yttrium, the halides may be formed predominantly and most of the getter metal transported away from the crucible. During the reaction and transport process, however, the getter metal efficiently ties up or removes oxygen from the group III metal and from sources of oxygen in the gas phase, including $O_2$ and $H_2O$. In the case of other getters, for example, Cr and Ta, the nitrides may be formed predominantly and most of the getter metal may remain in the crucible in the form of nitride, oxynitride, and oxide inclusions within the polycrystalline group III nitride for processes that involve exposure the of the group III metal crucible to a nitrogen-containing source. During the reaction and transport process, the getter metal efficiently ties up or removes oxygen from the group III metal and/or from sources of oxygen in the gas phase.

In some embodiments, including those not involving the addition of a hydrogen halide to the reaction, most or all of the getter may become incorporated into the polycrystalline group III nitride composition.

Referring to FIG. 1, after the polycrystalline composition has been formed, the housing 102 may be opened at an outlet side. Opening on the outlet side may localize any introduced contaminants to the chamber 108 caused by the opening to the chamber side proximate to the outlet 118. Localizing the contaminants proximate to the outlet 118 may reduce the distance the contaminants must travel to purge from the chamber 108, and may confine the path of the contaminants to regions in which the contaminants are less likely to contact any grown crystal, or crystalline composition growing surface (such as an inner surface of the crucible 120). In addition, not opening the housing on the inlet side may decrease the likelihood of a leak proximate to the inlet during a subsequent run. Thus, such a configuration may reduce the chance of contaminants contaminating the produced crystals. In another embodiment, the housing 102 may be opened on an inlet side of the chamber 108. In certain embodiments, the housing 102 is connected to a glove box and may be opened without exposing chamber 108 to ambient air.

Figure 2:
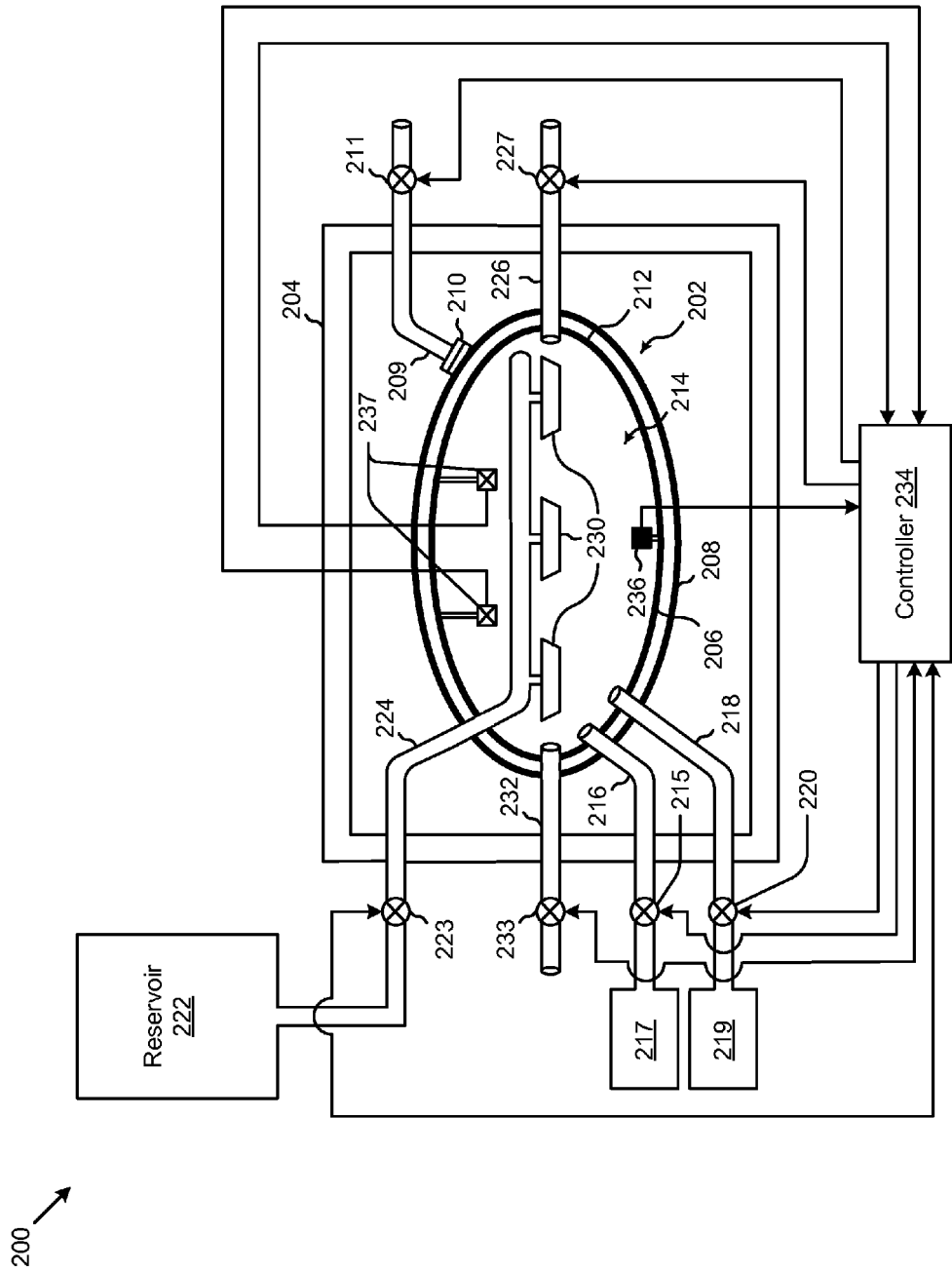

An apparatus 200 in accordance with an embodiment is shown in FIG. 2. The apparatus 200 may include a housing 202, and an energy source 204 proximate to the housing 202. The housing 202 may include an inner wall 206 and an outer wall 208. An inlet 209 may extend through the outer wall 208, but may stop short of the inner wall 206. The outer wall 208 may have an outward facing surface. An inward facing surface or inner surface 212 of the inner wall 206 may define a chamber 214.

The inner wall 206 may be nested within, and spaced from, the outer wall 208. The space between the walls 206 and 208 may be used to circulate an environmental control fluid that may enter the space through the inlet 209 configured for that purpose. The outer wall 208 may be formed from metal or quartz, while the inner wall 206 may be made of quartz or from boron nitride. The energy source 204 may be proximate to the outer wall 208.

A first inlet 216, a second inlet 218, a raw material inlet 224, a dopant inlet 232, and an outlet 226 may extend through the inner and outer walls 206 and 208. An additional inlet for a vapor phase getter (not shown) may also extend through the inner and outer walls 206 and 208. A plurality of valves 215, 220, 223, 233 may be disposed, one per tube, within the feed tubes that extend from sources to the corresponding inlets 216, 218, 224, and 232. The individual feed tubes are not identified with reference numbers. And, an outlet 226 may have a valve 227 that may allow or block the flow of fluid therethrough.

A first inlet 216 may communicate with a nitrogen-containing gas source 217 and flow a nitrogen-containing gas into the chamber 214. The nitrogen-containing gas may include ammonia. The nitrogen-containing gas may be diluted with one or more carrier gases. The carrier gas may comprise argon, helium, hydrogen, or nitrogen, and may be controllable separately from the nitrogen-containing gas flow. A second inlet 218 may be in communication with a halide-containing gas source 219. The second inlet 218 may allow a halide-containing gas to flow from the halide-containing gas source 219 into the chamber 214. The valve 220 may control the flow of the halide-containing gas from the halide-containing gas source 219 through the second inlet 218 and into the chamber 214. The halide-containing gas may include hydrogen chloride or chlorine, which may have been diluted with a carrier gas. The raw material inlet 224 may communicate with a raw material reservoir 222. An exit end of the raw material inlet 224 may be positioned so as to flow raw material leaving the raw material inlet 224 into a crucible 230. The valve 223 may control the flow of the raw material from the reservoir 222 through the raw material inlet 224 and into the chamber 214. The raw material may include molten gallium.

A dopant source (not shown) may communicate with the chamber 214 through a dopant inlet 232. A valve 233 may be switched on/off to open or block a flow of dopant from the dopant source into the chamber 214. In the illustrated embodiment, the dopant may include silicon, which may be in the form of $SiCl_4$, or germanium, which may be in the form of $GeCl_4$.

An outlet 226 may allow for excess material to exit the chamber 214. A valve 227 may open or close, and by closing, a back pressure might be built up as additional materials are flowed into the chamber 214 and the temperature is increased.

A plurality of crucibles 230 may be provided in the chamber 214. The crucibles 230 may be arranged horizontally relative to each other and/or vertically. One or more sensors 236 and one or more sensors 237 may be provided to monitor the pressure and temperature, or other process parameters within the chamber 214.

As disclosed hereinabove, the environmental control fluid may flow in the space between the walls through the inlet 209. Inlet 209 may communicate with a circulation system (not shown) to circulate the fluid in the space between the walls. Inlet 209 may include a valve 211 to adjust or optimize the circulation in the space between the walls. Flanges 210 meant for vacuum systems may be used to form a leak proof connection. The fluid circulation system may have provisions to heat or cool the fluid. Chamber 214, along with its contents, may be cooled or heated through this arrangement.

A control system may include a controller 234 that may communicate with the various components as indicated by the communication lines. Through the lines, the controller 234 may receive information, such as signals, from sensors 236, 237. The controller 234 may signal to one or more of the valves 215, 220, 223, 227, 233, which may respond by opening or closing. The valve 211 may communicate with the controller 234, and through which the controller 234 may control the flow of the environmental control fluid from the circulation system. Thus, the controller 234 may monitor and may control the overall reaction conditions.

Prior to operation, the chamber 214 may be evacuated. The controller 234 may activate a valve 227 and a vacuum pump (not shown) to evacuate the chamber 214. The chamber 214 may be flushed with a gas, including an inert gas or a gas such as hydrogen which may be used to remove one or more contaminants from the chamber 214. The energy source 204 may be activated to heat, and thereby volatilize, any volatile contaminants. The successive evacuation and purging may remove the contaminants from the chamber 214.

During operation, the controller may activate a valve 223 to start a flow of raw material from a reservoir 222 to the crucibles 230 through a raw material inlet 224. A dopant may be flowed into the crucible through a dopant inlet 232 in response to the opening of the corresponding valve 233. The controller may adjust the rates of flow of materials by adjusting the degree to which the corresponding valves are open or closed. The controller 234 may communicate with the sensors 236, 237. The temperature and pressure within the chamber may be raised to determined levels by the controller 234 activating the energy source 204, and/or adjusting an outlet valve 227.

Once the desired temperature and pressure has been attained, a nitrogen-containing gas may be introduced in the chamber 214 through a first inlet 216. Alternatively, a nitrogen-containing gas may be introduced in the chamber in the beginning or at any point during the heating cycle. A halide-containing gas may be flowed in through a second inlet 218. The controller may adjust the flow rate of these gases by controlling the respective valves 215, 220.

The raw material including the dopants may react with the nitrogen-containing gas in the presence of the halide-containing gas. The reaction may proceed until the raw material reacts to form the metal nitride. In the illustrated embodiment, a silicon doped gallium nitride may be formed.

Figure 3:
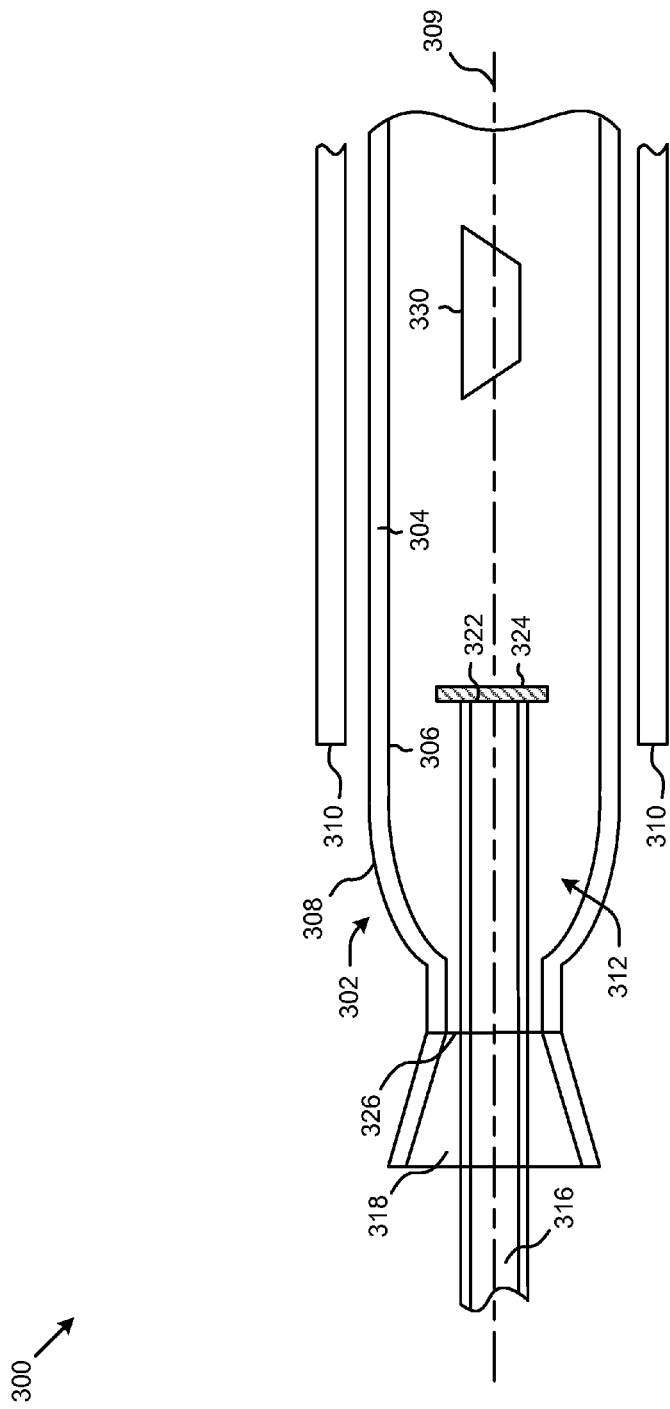

FIG. 3 is a schematic view of an apparatus 300 detailing the inlets in accordance with an embodiment. The apparatus 300 may include a housing 302 having a wall 304, the wall 304 may have an inner surface 306 and an outward facing surface 308, as illustrated in the figure. The wall 304 may be radially spaced from an axis 309. An energy source 310 may be provided proximate to the outer surface. The inner surface 306 of the wall 304 may define a chamber 312.

The apparatus 300 may further include inlets 316 and 318. The inlet 316, in one embodiment, may be a single walled tube, and extends into the chamber 312 through the wall 304. The inlet 316 may be nested within, and spaced from the inner surface 306 of the wall 304. An exit end of the inlet 316 may define an aperture 322. A baffle 324 may adjoin the aperture 322. The spacing between the inlet 316 and the inner surface 306 of the wall 304 may define the inlet 318. Further, an aperture or opening 326 may be provided in the inlet 318. A crucible 330 may be disposed within the chamber 312.

A halide-containing gas may be introduced into the chamber 312 from a source (not shown) through the inlet 316, and a nitrogen-containing gas may be introduced into the chamber 312 from a source (not shown) through the inlet 318. The inlets 316 and 318 may be configured such that the baffle 324 provided in the inlet 316 may assist in proper mixing of the gases flowing in to the chamber 312 through the inlets.

The apparatus 300 may further include components not shown in the figure such as, a control system including a controller which may control the overall reaction, valves for adjusting and/or controlling the flow of materials to and/or from the chamber, inlets for introducing raw materials, getters, and/or dopants into the chamber, sources from where raw materials, getters, and/or dopants may be flowed into the chamber, sensors for monitoring the temperature, pressure and composition within the chamber, and the like. The working of the apparatus may be explained with reference to above described embodiments.

Figure 4:
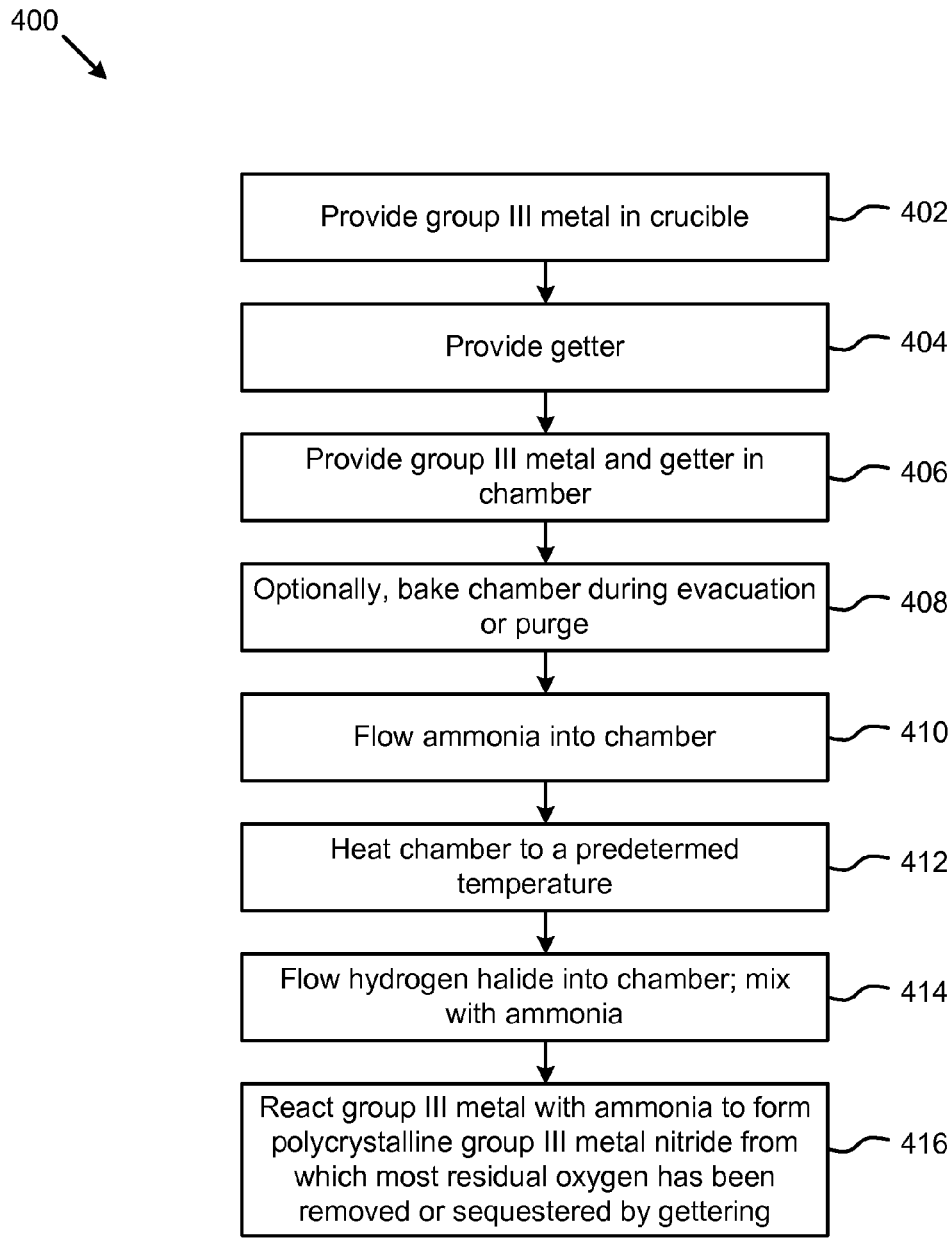
FIG. 4 is a simplified flow diagram of a synthesis method according to an embodiment.

FIG. 4 is a flow chart depicting a method for preparing a polycrystalline group III metal nitride in accordance with an embodiment according to the present disclosure. The method starts by providing a group III metal (see step 402) and a getter in a crucible (see step 404). The crucible containing the group III metal and the getter are then loaded into a chamber or reactor and the chamber is sealed (see step 406). The chamber is then evacuated, purged, and otherwise decontaminated to remove trace impurities. The chamber may be evacuated, purged, and otherwise decontaminated prior to or after loading the group III metal and the getter inside (see step 408). The environment in the chamber is adjusted to determined levels. The temperature of the chamber may be maintained between about 800 degree Celsius to about 1300 degree Celsius, and the pressure within the chamber may be equal to or greater than about ambient.

Dopants may be introduced in the chamber. The dopant may be introduced as a dopant precursor. The dopant precursor may be flowed into the chamber from a dopant source.

The temperature within the chamber may be raised to between about 800 degrees Celsius to about 1300 degrees Celsius (see step 412), and the pressure may be raised within at least one dimension greater than about 1 meter, for a period greater than about 30 minutes. Next, a nitrogen-containing gas such as ammonia may be introduced in the chamber (see step 410). The gas may be flowed from a nitrogen-containing gas source through an inlet into the chamber. The flow rate of the nitrogen-containing gas may be greater than about 250 (standard) cubic centimeters per minute.

A halide-containing gas may be introduced into the chamber (see step 414). Optionally, the order of the preceding steps may be interchanged. The flow rate of the halide-containing gas may be greater than about 25 cubic centimeters per minute. The ratio of the flow rate of the nitrogen-containing gas to the flow rate of the halide-containing gas may be about 10:1.

The group III metal may react with the nitrogen-containing gas in the presence of the halide to form a polycrystalline group III metal nitride from which most residual oxygen has been removed or sequestered by gettering (see step 416). The halide affects the reaction between the metal and the nitrogen-containing gas in a determined manner. The getter reacts with oxygen to form a getter metal oxide, oxynitride, or oxyhalide, and additionally with the nitrogen-containing gas to form getter metal nitride and with the hydrogen halide to form getter metal halide.

The reaction may proceed through a vapor transport and/or a wicking effect. The metal nitride crust may form on top of the molten metal within the crucible. The crust may be slightly porous. The metal may be vapor transported or, if liquid, wicked to the top of the crust through the pores and react with the nitrogen-containing gas. The reaction may deposit additional metal nitride and add to the crust. The reaction proceeds until virtually all the metal has undergone reaction. Additional metal may be flowed into the chamber from the reservoir.

Figure 5:
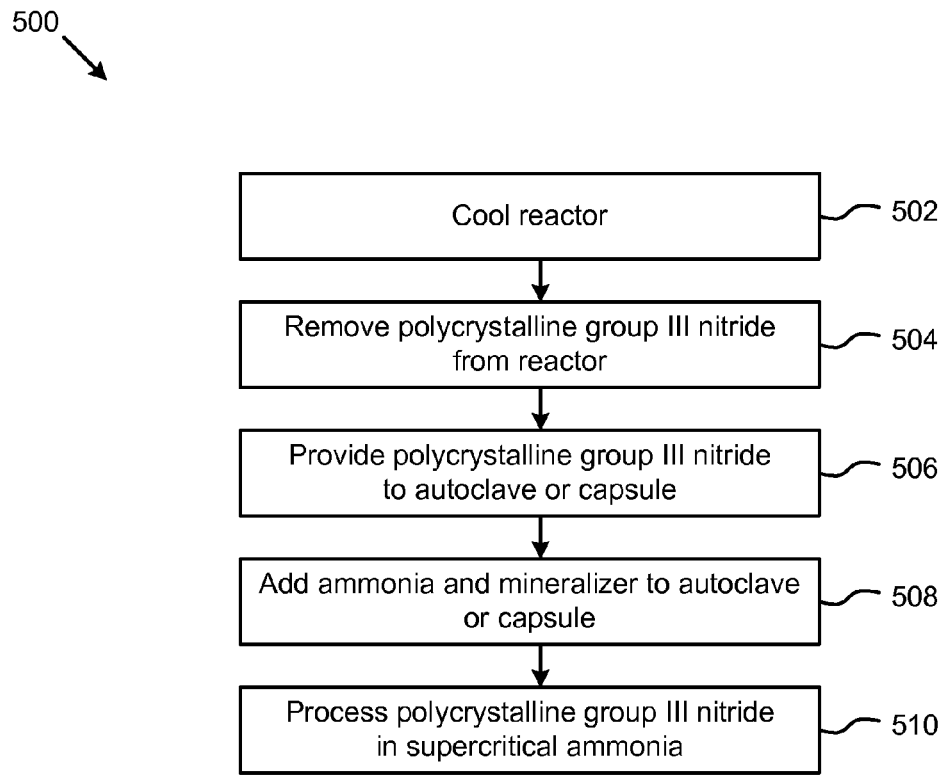
FIG. 5 is a simplified flow diagram of utilization method according to an embodiment.

The chamber may be cooled, see FIG. 5, as an example (see step 502). The excess nitrogen-containing gas and hydrogen halide flows out from the reaction zone and ammonium halide may condense on cooler regions of the chamber or outlet. In one embodiment, the chamber and an outlet may be kept hot so as to facilitate downstream trapping of ammonium halide; or alternatively a cold wall section may be incorporated to facilitate condensation of the ammonium halide. In one embodiment, the chamber may be opened on the outlet side to minimize leakage through the inlet side. The polycrystalline group III metal nitride may be removed through the outlet side (see step 504).

Optionally, the polycrystalline group III metal nitride formed may be further processed. In one embodiment, at least one surface of the polycrystalline group III metal nitride may be subjected to one or more of scraping, scouring or scarifying. The surface may be further subjected to oxidation in air or in dry oxygen and it may further be boiled in perchloric acid. The residual contamination resulting from the post-processing step may be removed by washing, sonicating, or both. Washing and sonicating may be performed in, for example, organic solvents, acids, bases, oxidizers (such as hydrogen peroxide), and the like. The polycrystalline group III metal nitride may be annealed in an inert, nitriding, or reducing atmosphere. The annealing may also be performed in pure ammonia at a temperature of about 800 degree Celsius to about 1300 degree Celsius for a period of time in a range of from about 30 minutes to about 200 hours.

Other processing may be performed for use as a source material for crystalline composition growth. For use as a source material, the polycrystalline group III metal nitride may be pulverized into particulate. The particles may have an average diameter in a range of from about 0.3 millimeters to about 10 millimeters. The pulverizing may be carried out through, for example, compressive fracture, jaw crushing, wire sawing, ball milling, jet milling, laser cutting, or cryofracturing. Post pulverization cleaning operations may remove adventitious metal introduced by the pulverization operation, un-reacted metal, and undesirable metal oxide.

In some embodiments, the polycrystalline group III metal nitride is used as a source material for ammonothermal growth of at least one group III metal nitride single crystal. The polycrystalline group III metal nitride is placed in an autoclave or a capsule, as described in U.S. Pat. No. 6,656,615, U.S. Patent No. 7,125,453, and U.S. Pat. No. 7,078,731 and in U.S. Patent Application Publication No. 2009/0301388 (see step 506). Ammonia and a mineralizer, for example, at least one of an alkali metal, amide, nitride, or azide, an alkaline earth metal, amide, nitride, or azide, ammonium fluoride, ammonium chloride, ammonium bromide, ammonium iodide, a group III metal fluoride, a group III metal chloride, a group III metal bromide, a group III metal iodide, or a reaction product between a group III metal, ammonia, HF, HBr, HI, and HCl are also placed in the autoclave or capsule (see step 508).

In some embodiments a getter is also placed in the autoclave or capsule. The added getter may be provided in addition to a getter composition that may be present in the polycrystalline group III nitride. The added getter may comprise at least one of alkaline earth metals, Sc, Ti, V, Cr, Y, Zr, Nb, Hf, Ta, W, rare earth metals, and their nitrides, halides, oxynitrides, oxyhalides, amides, imides, and azides. In one specific embodiment, at least a portion of the getter is added in the form of a metal and at least a portion of the mineralizer is added as an azide in such a ratio that the hydrogen generated by reaction of the getter metal with ammonia and the nitrogen generated by decomposition of the azide are present in a ratio of approximately 3:1, as described in U.S. Pat. No. 8,323,405. The added getter may be useful for removing unintentional impurities, for example, oxygen, that are present in the mineralizer or other raw material. In one set of embodiments, the mineralizer comprises an alkali metal and the getter comprises a nitride, imide, or amide of Be, Mg, Ca, Sr, Ba, Sc, Y, a rare earth metal, Ti, Zr, Hf, V, Nb, Ta, Cr, Mo, or W. In another set of embodiments, the mineralizer comprises Cl and the getter comprises a nitride, chloride, oxynitride, or oxychloride of Sc, Ti, Cr, Zr, Nb, a rare earth metal, Hf, Ta, or W. In still another set of embodiments, the mineralizer comprises F and the getter comprises a nitride, fluoride, oxynitride, or oxyfluoride of Ti, V, Cr, Zr, Nb, Hf, Ta, or W. In another set of embodiments, the mineralizer comprises Br and the getter comprises a nitride, bromide, oxynitride, or oxybromide of Sc, Ti, Cr, Y, Zr, Nb, a rare earth metal, Hf, Ta, or W. In another set of embodiments, the mineralizer comprises I and the getter comprises a nitride, iodide, oxynitride, or oxyiodide of Sc, Ti, Cr, Y, Zr, Nb, a rare earth metal, Hf, Ta, or W.

After all the raw materials have been added to the autoclave or capsule, the autoclave or capsule is sealed.

The capsule, if employed, is then placed within a suitable high pressure apparatus. In one embodiment, the high pressure apparatus comprises an autoclave, as described by U.S. Pat. No. 7,335,262. In another embodiment, the high pressure apparatus is an internally heated high pressure apparatus, as described in U.S. Pat. No. 7,125,453, U.S. Pat. No. 8,097,081, and in U.S. Application Publication No. 2006/0177362A1. The polycrystalline group III metal nitride is then processed in supercritical ammonia at a temperature greater than about 400 degrees Celsius and a pressure greater than about 0.02 gigaPascal (GPa), during which at least a portion of the polycrystalline group III metal nitride is etched away and recrystallized onto at least one group III nitride crystal with a wurtzite structure (see step 510). In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 0.02 GPa, greater than about 0.05 GPa, greater than about 0.1 GPa, greater than about 0.2 GPa, greater than about 0.3 GPa, greater than about 0.4 GPa, greater than about 0.5 GPa, greater than about 0.6 GPa, greater than about 0.7 GPa, or greater than about 0.8 GPa.

Residual getter in the polycrystalline group III metal nitride is released into solution gradually, as the polycrystalline group III metal nitride is etched. Once in solution, the getter may react to form a getter metal nitride, amide, or halide. The getter may also be chemically bound to oxygen. The getter may remove residual oxygen in the supercritical ammonia solution, enabling growth of group III nitride single crystals with improved purity.

In some embodiments, the added getter is annealed and/or coarsened prior to substantial ammonothermal growth of a group III metal nitride. In some embodiments, the getter may be added as a fine powder or may form a fine powder during heating in ammonia with a mineralizer present, which may undergo undesirable convection throughout the crystal growth environment and/or become incorporated into a crystalline group III metal nitride as an inclusion. The getter may be consolidated by holding at a temperature lower than that at which significant group III metal nitride crystal growth occurs, for example, between about 200 degrees Celsius and about 500 degrees Celsius, for a period of time between about 10 minutes and about 48 hours.

The ammonothermally-grown crystalline group III metal nitride may be characterized by a wurtzite structure substantially free from any cubic entities and have an optical absorption coefficient of about 2 cm$^{-1}$ and less at wavelengths between about 405 nanometers and about 750 nanometers. An ammonothermally-grown gallium nitride crystal may comprise a crystalline substrate member having a length greater than about 5 millimeters, have a wurtzite structure and be substantially free of other crystal structures, the other structures being less than about 0.1% in volume in reference to the substantially wurtzite structure, an impurity concentration greater than $10^{14}$ cm$^{-1}$, greater than $10^{15}$ cm$^{-1}$, or greater than $10^{16}$ cm$^{-1}$ of at least one of Li, Na, K, Rb, Cs, Ca, F, Br, I, and Cl, and an optical absorption coefficient of about 2 cm$^{-1}$ and less at wavelengths between about 405 nanometers and about 750 nanometers. The ammonothermally-grown gallium nitride crystal may be semi-insulating, with a resistivity greater than $10^7$ Ω-cm. The ammonothermally-grown gallium nitride crystal may be an n-type semiconductor, with a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than about $-0.018557$ n$^3$+1.0671 n$^2$−20.599 n+135.49. The ammonothermally-grown gallium nitride crystal may be a p-type semiconductor, with a carrier concentration n between about $10^{16}$ cm$^{-3}$ and $10^{20}$ cm$^{-3}$ and a carrier mobility η, in units of centimeters squared per volt-second, such that the logarithm to the base 10 of η is greater than about $-0.6546$ n+12.809.

By growing for a suitable period of time, the ammonothermally-grown crystalline group III metal nitride may have a thickness of greater than about 1 millimeter and a length, or diameter, greater than about 20 millimeters. In a specific embodiment, the length is greater than about 50 millimeters or greater than about 100 millimeters. The crystalline group III nitride may be characterized by crystallographic radius of curvature of greater than 1 meter, greater than 10 meters, greater than 100 meters, greater than 1000 meter, or be greater than can be readily measured (infinite). After growth, the ammonothermally-grown crystalline group III metal nitride may be sliced, lapped, polished, and chemical-mechanically polished according to methods that are known in the art to form one or more wafers or crystalline substrate members. In a specific embodiment, the root-mean-square surface roughness of the at least one wafer or crystalline substrate member is less than about one nanometer, for example, as measured by atomic force microscopy over an area of at least about 10 micrometers by 10 micrometers.

In another embodiment, the polycrystalline group III metal nitride is used as a source material for flux growth of at least one group III metal nitride single crystal, as described in U.S. Pat. 7,063,741 and in U.S. Patent Application 2006/0037529. The polycrystalline group III metal nitride and at least one flux are placed in a crucible and inserted into a furnace. The furnace is heated and the polycrystalline group III metal nitride is processed in a molten flux at a temperature greater than about 400 degrees Celsius and a pressure greater than about one atmosphere, during which at least a portion of the polycrystalline group III metal nitride is etched away and recrystallized onto at least one group III nitride crystal. Residual getter in the polycrystalline group III metal nitride is released into solution gradually, as the polycrystalline group III metal nitride is etched. Once in solution, the getter may react to form a getter metal nitride, amide, or halide. The getter may also be chemically bound to oxygen. The getter may remove residual oxygen in the molten flux, enabling growth of group III nitride single crystals with improved purity.

Figure 6:
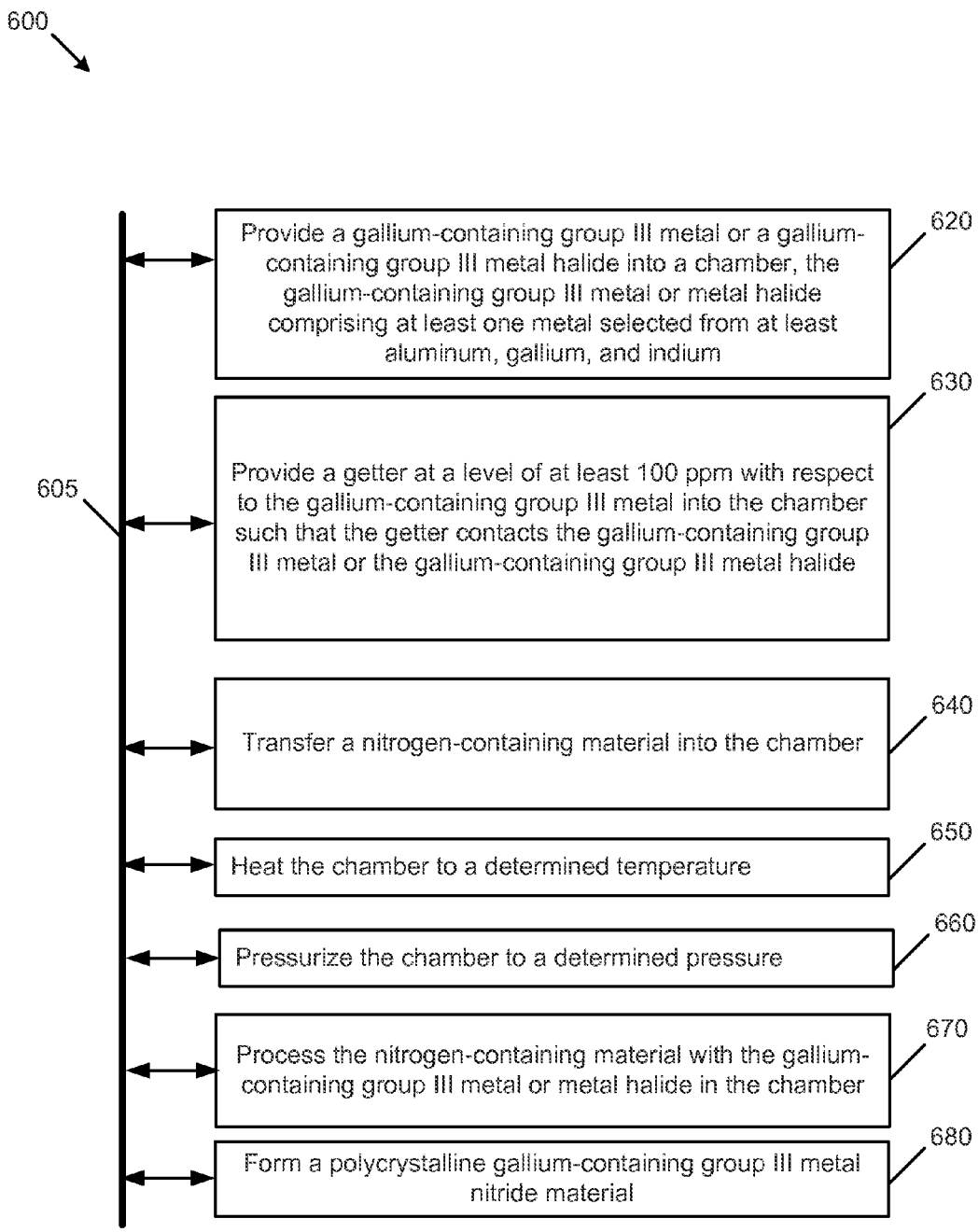
FIG. 6 is a simplified system diagram according to an embodiment.

FIG. 6 depicts a block diagram of a system to perform certain operations within the context of the architecture and functionality of the embodiments described herein. Of course, however, the system 600 or any operation therein may be carried out in any desired environment. As shown, an operation can be implemented in whole or in part using program instructions accessible by a module. The modules are connected to a communication path 605, and any operation can communicate with other operations over communication path 605. The modules of the system can, individually or in combination, perform method operations within system 600. Any operations performed within system 600 may be performed in any order unless as may be specified in the claims. The embodiment of FIG. 6 implements a portion of a computer or control system, shown as system 600, comprising modules for accessing memory to hold program code instructions to perform: providing a gallium-containing group III metal or a gallium-containing group III metal halide into a chamber, the gallium-containing group III metal or metal halide comprising at least one metal selected from at least aluminum, gallium, and indium (see module 620); providing a getter at a level of at least 100 ppm with respect to the gallium-containing group III metal into the chamber such that the getter contacts the gallium-containing group III metal or the gallium-containing group III metal halide (see module 630); transferring a nitrogen-containing material into the chamber (see module 640); heating the chamber to a determined temperature (see module 650); pressurizing the chamber to a determined pressure (see module 660); processing the nitrogen-containing material with the gallium-containing group III metal or metal halide in the chamber (see module 670); and forming a polycrystalline gallium-containing group III metal nitride material (see module 680).

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A method of preparing a polycrystalline group III metal nitride material, comprising:
    providing a source material selected from a group III metal , a group III metal halide, or a combination thereof into a chamber, the source material comprising at least one metal selected from at least aluminum, gallium, and indium;
    providing a getter at a level of at least 100 ppm with respect to the source material into the chamber such that the getter contacts the source material, wherein the getter is provided to the chamber via a vapor phase;
    transferring a nitrogen-containing material into the chamber;
    heating the chamber to a determined temperature;
    pressurizing the chamber to a determined pressure;
    processing the nitrogen-containing material with the source material in the chamber; and forming a polycrystalline group III metal nitride material.

2. The method of claim 1, wherein the getter comprises at least one of an alkaline earth metal, boron, carbon, scandium, titanium, vanadium, chromium, yttrium, zirconium, niobium, a rare earth metal, hathium, tantalum, and tungsten, a nitride of any of the foregoing, an oxynitride of any of the foregoing, an oxyhalide of any of the foregoing, and a halide of any of the foregoing.

3. The method of claim 1, wherein the getter comprises at least one of boron, carbon, scandium, yttrium, and a rare earth metal.

4. The method of claim 1, wherein the getter is provided into a crucible within the chamber together with the source material.

5. The method of claim 4, wherein the getter is provided at a level greater than about 0.1% with respect to the source material.

6. The method of claim 1, wherein the getter is provided at a level greater than 300 parts per million with respect to the source material.

7. The method of claim 6, wherein the getter is provided at a level greater than about 1% with respect to the source material.

8. The method of claim 1, further comprising supplying a dopant or a dopant precursor to the chamber.

9. The method of claim 1, further comprising contacting the source material with one or more wetting agents, wherein the one or more wetting agents comprises bismuth, germanium, tin, lead, antimony, tellurium, polonium, and a combination of any of the foregoing.

10. The method of claim 1, further comprising:
cooling the chamber;
removing the polycrystalline group III nitride material from the chamber;
providing the polycrystalline group III nitride material to an autoclave or a capsule along with ammonia and a mineralizer; and
processing the polycrystalline group III nitride material in supercritical ammonia at a temperature greater than 400 degrees Celsius.

11. The method of claim 10, wherein the mineralizer comprises at least one of an alkali metal and an alkaline earth metal.

12. The method of claim 11, further comprising providing an additional getter comprising at least one of Be, Ca, Sr, Ba, Sc, Y, a rare earth metal, Ti, Zr, Hf, V, Nb, Ta, Cr, Mo, and W.

13. The method of claim 10, wherein the mineralizer comprises at least one of a chloride, a bromide, an iodide, and a fluoride.

14. The method of claim 13, further comprising providing an additional getter comprising at least one of Sc, Ti, V, Cr, Y, Zr, Nb, a rare earth metal, Hf, Ta, or W.

15. The method of claim 1, further comprising:
cooling the chamber;
removing the polycrystalline group III nitride material from the chamber;
providing the polycrystalline group III nitride material to a furnace along with a flux; and
processing the polycrystalline group III nitride material in a molten flux at a temperature greater than 400 degrees Celsius.

16. The method of claim 1, wherein the getter comprises one or more of a hydrocarbon ($C_wH_y$, where w, y > 0), a halocarbon $C_wX_z$, where w, z > 0 and X is selected from F, Cl, Br, and I), a halohydrocarbon ($C_wH_yX_z$, where w, y, z > 0 and X is selected from F, Cl, Br, and I), phosgene ($COCl_2$), thionyl chloride ($SOCl_2$), boron trichloride ($BCl_3$), diborane ($B_2H_6$), hydrogen sulfide ($H_2S$), a halide of an alkaline earth metal, boron, carbon, scandium, titanium, vanadium, chromium, yttrium, zirconium, niobium, the rare earth metals, hathium, tantalum, or tungsten, a hydride of an alkaline earth metal, boron, carbon, scandium, titanium, vanadium, chromium, yttrium, zirconium, niobium, the rare earth metals, hafnium, tantalum, or tungsten.

17. The method of claim 1, wherein the polycrystalline group III metal nitride material is formed downstream from a crucible containing the source material.

18. The method of claim 1, wherein one or more of a crucible for containment of group III metal, a reactor housing wall, a liner for the chamber, a gas inlet to the chamber, a baffle for gas mixing, and a substrate on which the polycrystalline group III metal nitride material is deposited comprises a material selected from tantalum carbide (TaC), silicon carbide (SiC), and pyrolytic boron nitride.

19. The method of claim 1, wherein one or more components of the chamber are loaded from a glove box before synthesis and the polycrystalline group III metal nitride material is removed from the chamber to the glove box after synthesis without substantial exposure to ambient air.

20. The method of claim 1, wherein:
the polycrystalline group III metal nitride material is a polycrystalline gallium-containing group III metal nitride material;
the group III metal is a gallium-containing group III metal; and
the group III metal halide is a gallium-containing group III metal halide.

21. The method of claim 1, wherein:
the determined temperature is from 800° C. to 1,300 ° C.; and
the determined pressure is greater than 0.02 GPa.

22. A method of forming a polycrystalline gallium-containing group III metal nitride material, comprising:
providing a gallium-containing group III metal or a group III metal halide source material to a chamber, the gallium-containing group III metal or metal halide source material comprising at least one metal selected from aluminum, gallium, and indium;
providing a getter at a level of at least 100 ppm with respect to the source material into the chamber such that the getter contacts the source material;
transferring a nitrogen-containing material into the chamber;
heating the chamber to a determined temperature;
pressurizing the chamber to a determined pressure;
processing the nitrogen-containing material with the source material in the chamber to form a polycrystalline gallium-containing group III metal nitride material comprising a plurality of grains of a crystalline gallium-containing group III metal nitride;
the plurality of grains having an average grain size in a range from about 10 nanometers to about 10 millimeters and defining a plurality of grain boundaries; and
the polycrystalline gallium-containing group III metal nitride material having:
an atomic fraction of a gallium-containing group III metal in a range from about 0.49 to about 0.55, the gallium-containing group III metal being selected from at least one of aluminum, indium, and gallium; and
an oxygen content in the form of a gallium-containing group III metal oxide or a substitutional impurity within the polycrystalline gallium-containing group III metal nitride material less than about 10 parts per million (ppm); and a plurality of inclusions within at least one of the plurality of grain boundaries and the plurality of grains, the plurality of inclusions comprising a getter, the getter constituting a distinct phase from the crystalline gallium-containing group III metal nitride and located within individual grains of the crystalline gallium-containing group III metal nitride and/or at the grain boundaries of the crystalline gallium-containing group III metal nitride and being incorporated into the polycrystalline gallium-containing group III metal nitride at a level greater than about 200 parts per million, and;

forming a crystalline gallium-containing group III metal nitride crystal from the polycrystalline gallium-containing group III metal nitride material characterized by a wurtzite structure substantially free from any cubic entities and an optical absorption coefficient less than or equal to about 2 cm$^{-1}$ at wavelengths between about 405 nanometers and about 750 nanometers.

23. The method of claim 22, wherein the polycrystalline gallium-containing group III metal nitride material comprises a plurality of grains of a crystalline gallium-containing group III metal nitride; wherein the plurality of grains is characterized by an average grain size in a range of from about 10 nanometers to about 10 millimeters and defines a plurality of grain boundaries; and the polycrystalline gallium-containing group III metal nitride material is characterized by:

an atomic fraction of a gallium-containing group III metal in a range of from about 0.49 to about 0.55, the gallium-containing group III metal being selected from at least one of aluminum, indium, and gallium; and an oxygen content in the form of a gallium-containing group III metal oxide or a substitutional impurity within the crystalline gallium-containing group III metal nitride less than about 10 parts per million (ppm); and a plurality of inclusions within at least one of the plurality of grain boundaries and the plurality of grains, the plurality of inclusions comprising a getter, the getter constituting a distinct phase from the crystalline gallium-containing group III metal nitride and located within individual grains of the crystalline gallium-containing group III metal nitride and/or at grain boundaries of the crystalline gallium-containing group III metal nitride and being incorporated into the polycrystalline gallium-containing group III metal nitride material at a level greater than about 200 parts per million.

* * * * *